(12) United States Patent
Schiwon et al.

(10) Patent No.: US 8,518,820 B2
(45) Date of Patent: Aug. 27, 2013

(54) METHODS FOR FORMING CONTACTS IN SEMICONDUCTOR DEVICES

(75) Inventors: Roberto Schiwon, Hopewell Junction, NY (US); Klaus Herold, Fishkill, NY (US); Jenny Lian, Walkill, NY (US); Sajan Marokkey, Wappingers Falls, NY (US); Martin Ostermayr, Beacon, NY (US)

(73) Assignee: Infineon Technologies AG, Neubiberg (DE)

( * ) Notice: Subject to any disclaimer, the term of this patent is extended or adjusted under 35 U.S.C. 154(b) by 98 days.

(21) Appl. No.: 13/301,196

(22) Filed: Nov. 21, 2011

(65) Prior Publication Data

US 2012/0070977 A1    Mar. 22, 2012

Related U.S. Application Data

(62) Division of application No. 12/360,599, filed on Jan. 27, 2009, now abandoned.

(51) Int. Cl.
*H01L 21/4763* (2006.01)

(52) U.S. Cl.
USPC ........... 438/637; 438/666; 438/672; 257/758; 257/774

(58) Field of Classification Search
None
See application file for complete search history.

(56) References Cited

U.S. PATENT DOCUMENTS

| | | | |
|---|---|---|---|
| 5,929,469 A | 7/1999 | Mimoto et al. | |
| 6,368,754 B1 | 4/2002 | Imai | |
| 6,433,398 B1 | 8/2002 | Suzuki et al. | |
| 6,553,562 B2 | 4/2003 | Capodieci et al. | |
| 6,627,392 B2 | 9/2003 | Pforr et al. | |
| 6,823,499 B1 | 11/2004 | Vasishta et al. | |
| 6,855,486 B1 | 2/2005 | Finders et al. | |
| 7,005,235 B2 * | 2/2006 | Lin | 430/311 |
| 7,142,282 B2 | 11/2006 | Borodovsky | |
| 2003/0104319 A1 * | 6/2003 | Lin et al. | 430/313 |
| 2005/0085085 A1 * | 4/2005 | Borodovsky | 438/706 |
| 2007/0040188 A1 | 2/2007 | Tsai et al. | |
| 2009/0111056 A1 * | 4/2009 | Hendel et al. | 430/296 |

* cited by examiner

*Primary Examiner* — Evan Pert
*Assistant Examiner* — Andres Munoz
(74) *Attorney, Agent, or Firm* — Slater & Matsil, L.L.P.

(57) ABSTRACT

Mask sets, layout design, and methods for forming contacts in devices are described. In one embodiment, a semiconductor device includes a plurality of contacts disposed over a substrate, the plurality of contacts being disposed as rows and columns on an orthogonal grid, each row of the plurality of contacts is spaced from an neighboring row of the plurality of contacts by a first distance, and each column of the plurality of contacts is spaced from an neighboring column of the plurality of contacts by a second distance.

26 Claims, 27 Drawing Sheets

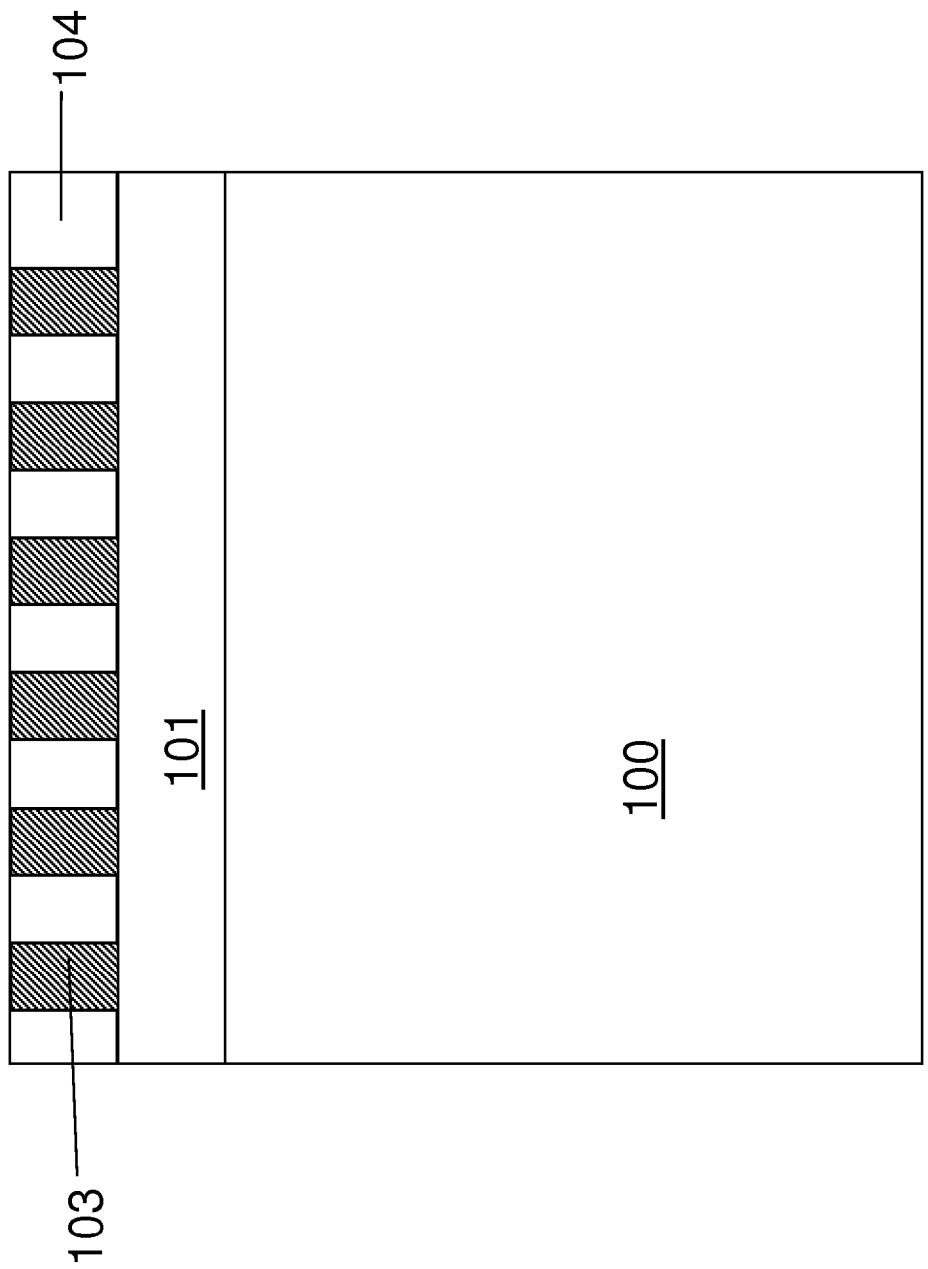

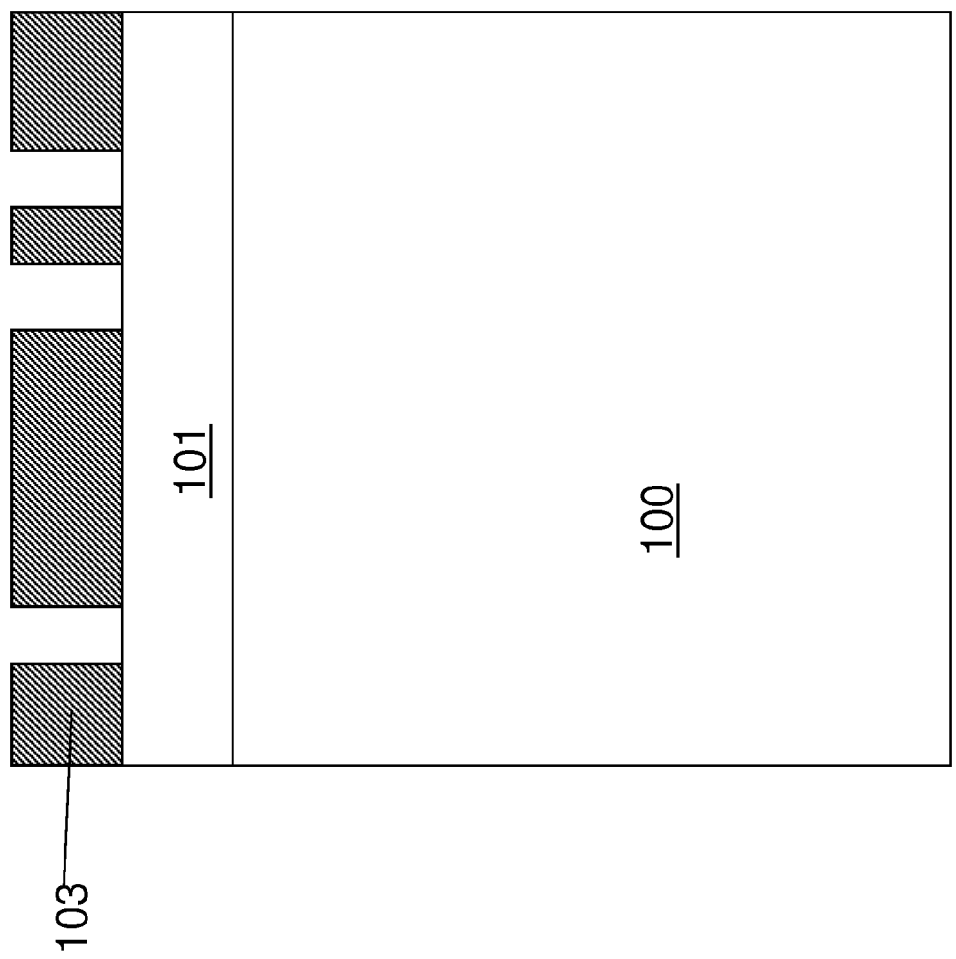

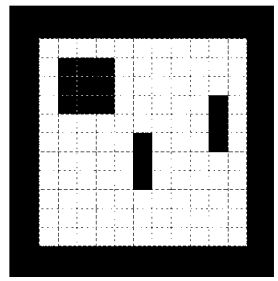
Figure 5c
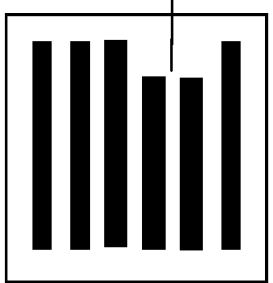
Figure 5b
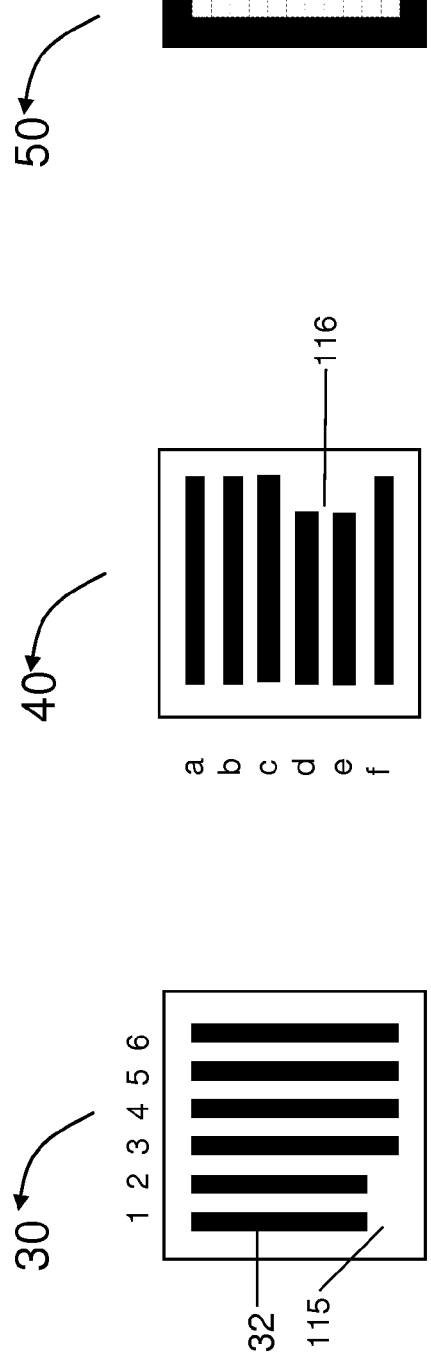
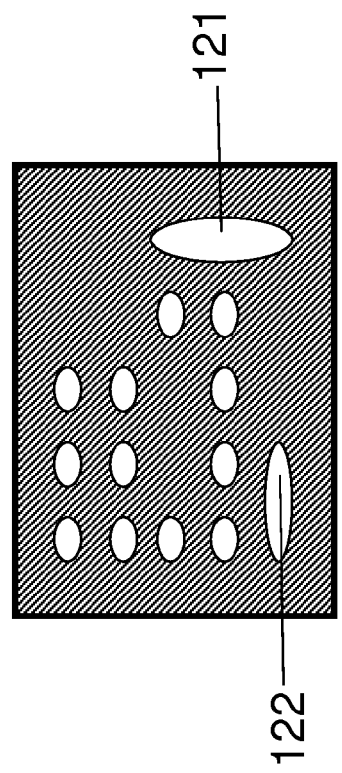
Figure 5e
Figure 5a
Figure 5d

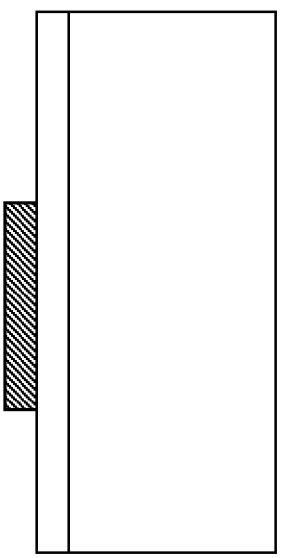
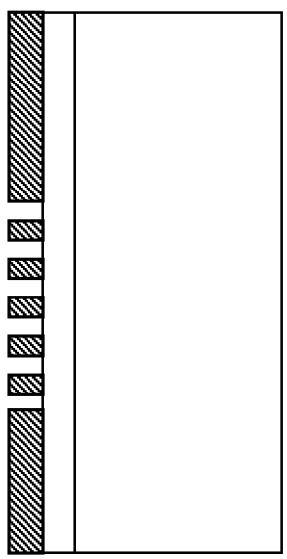
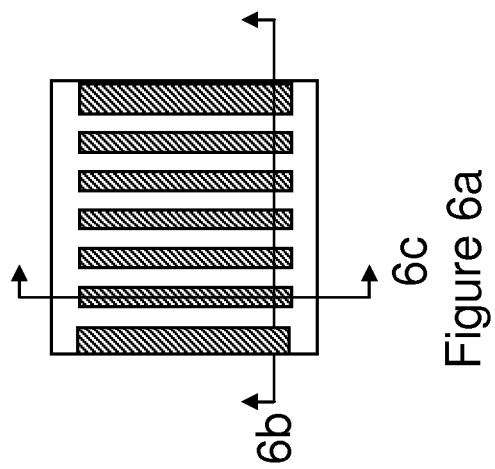
Figure 6c
Figure 6b
Figure 6a

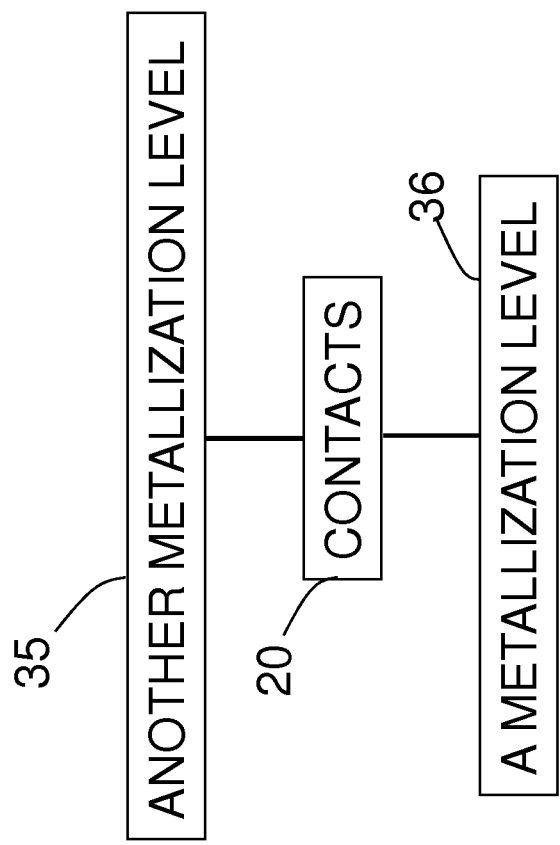

METHODS FOR FORMING CONTACTS IN SEMICONDUCTOR DEVICES

This application is a divisional of U.S. application Ser. No. 12/360,599, entitled, "Contacts in Semiconductor Devices," filed on Jan. 27, 2009, which application is hereby incorporated herein by reference.

TECHNICAL FIELD

The present invention relates generally to semiconductor devices, and more particularly to contacts for semiconductor devices and mask sets, layouts, and methods of fabrication thereof.

BACKGROUND

Generally, semiconductor devices are used in a variety of electronic applications, such as computers, cellular phones, personal computing devices, and many other applications. For example, home, industrial, and automotive devices that, in the past, comprised only mechanical components now have electronic parts that require semiconductor devices.

Semiconductor devices are manufactured by depositing many different types of material layers over a semiconductor workpiece or wafer, and patterning the various material layers using lithography. The material layers typically comprise thin films of conductive, semi-conductive and insulating materials that are patterned and etched to form integrated circuits (ICs). There may be a plurality of transistors, memory devices, switches, conductive lines, diodes, capacitors, logic circuits, and other electronic components formed on a single die or chip, for example.

The accurate reproduction of patterns on the surface of a semiconductor substrate is critical to the proper fabrication of semiconductor devices. The semiconductor substrate may have undergone previous fabrication processes and may already feature layers and structures created by those fabrication processes. Improperly reproduced patterns can result in semiconductor devices that do not operate to design specifications or that do not operate at all. For example, transistors can be created with improperly sized gates; conductors can be created that are short circuited or open circuited with other conductors or devices; structures can be created with wrong geometries, and so forth. Improperly reproduced patterns can reduce the yield of the fabrication process, thereby increasing the overall cost of the product. The reproduction process typically involves the use of optical lithography to reproduce the patterns onto the surface of the semiconductor substrate followed by a variety of processes either to subtract (for example, etch) or to add (for example, deposit) materials from and to the semiconductor substrate.

There is a trend in the semiconductor industry towards reducing the size of features, e.g., the circuits, elements, conductive lines, and vias of semiconductor devices, in order to increase performance of the semiconductor devices, for example. The minimum feature size of semiconductor devices has steadily decreased over time. However, as features of semiconductor devices become smaller, it becomes more difficult to pattern the various material layers because of diffraction and other effects that occur during a lithography process. Interference and processing effects can cause distortion and deviation in the mask's patterns as they are reproduced onto the semiconductor substrate. For example, key metrics such as resolution and depth of focus of the imaging systems may suffer when patterning features at small dimensions.

Shrinking device geometries have a particularly acute affect on patterning small contact holes. As contact holes become smaller, masks used to pattern contact holes require smaller apertures. The smaller the aperture, the more difficult it is to get enough light through the aperture to adequately expose the resist disposed on the semiconductor wafer below. If enough light is not used to expose the mask, a pattern will not print on the resist below. If, on the other hand, the mask and semiconductor wafer is exposed with a high intensity of light, the exposed pattern below becomes washed out and side-lobes are exposed beyond the desired perimeter of the exposed area. Consequently, the generation and exposure of small contact whole regions require a very narrow lithographic process window, thereby limiting the range of exposure settings that will produce an adequate exposure. These exposure settings can include illumination or dose, focus, numerical aperture, and light coherence factor, sigma.

Hence, what is needed are methods, designs and structures of producing small geometry contact holes without degrading manufacturing process windows.

SUMMARY OF THE INVENTION

These and other problems are generally solved or circumvented, and technical advantages are generally achieved, by preferred embodiments of the present invention.

Embodiments of the invention include contacts for semiconductor devices. In accordance with a preferred embodiment of the present invention, a semiconductor device includes a plurality of contacts disposed over a substrate. The plurality of contacts is disposed as rows and columns on an orthogonal grid. Each row of the plurality of contacts is spaced from a neighboring row of the plurality of contacts by a first distance. Each column of the plurality of contacts is spaced from a neighboring column of the plurality of contacts by a second distance.

The foregoing has outlined rather broadly the features of an embodiment of the present invention in order that the detailed description of the invention that follows may be better understood. Additional features and advantages of embodiments of the invention will be described hereinafter, which form the subject of the claims of the invention. It should be appreciated by those skilled in the art that the conception and specific embodiments disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawing, in which:

FIG. 2, which includes

FIG. 3, which includes

FIG. 5, which includes FIGS. 5a-5e, illustrates embodiments of the invention using additional notches or breaks;

FIG. 6, which includes FIGS. 6a-6e, illustrates an embodiment of forming contacts using negative tone resist for the first and second exposures, and a positive tone resist for the third exposure step;

FIG. 7, which includes

FIG. 9, which includes

FIG. 10, which includes FIG. 10A and 10B, illustrates an embodiment of contacts, wherein in FIG. 10A, the contacts couple semiconductor regions with metal lines, and wherein in FIG. 10B, the contacts couple between metallization levels;

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

Figure 1:
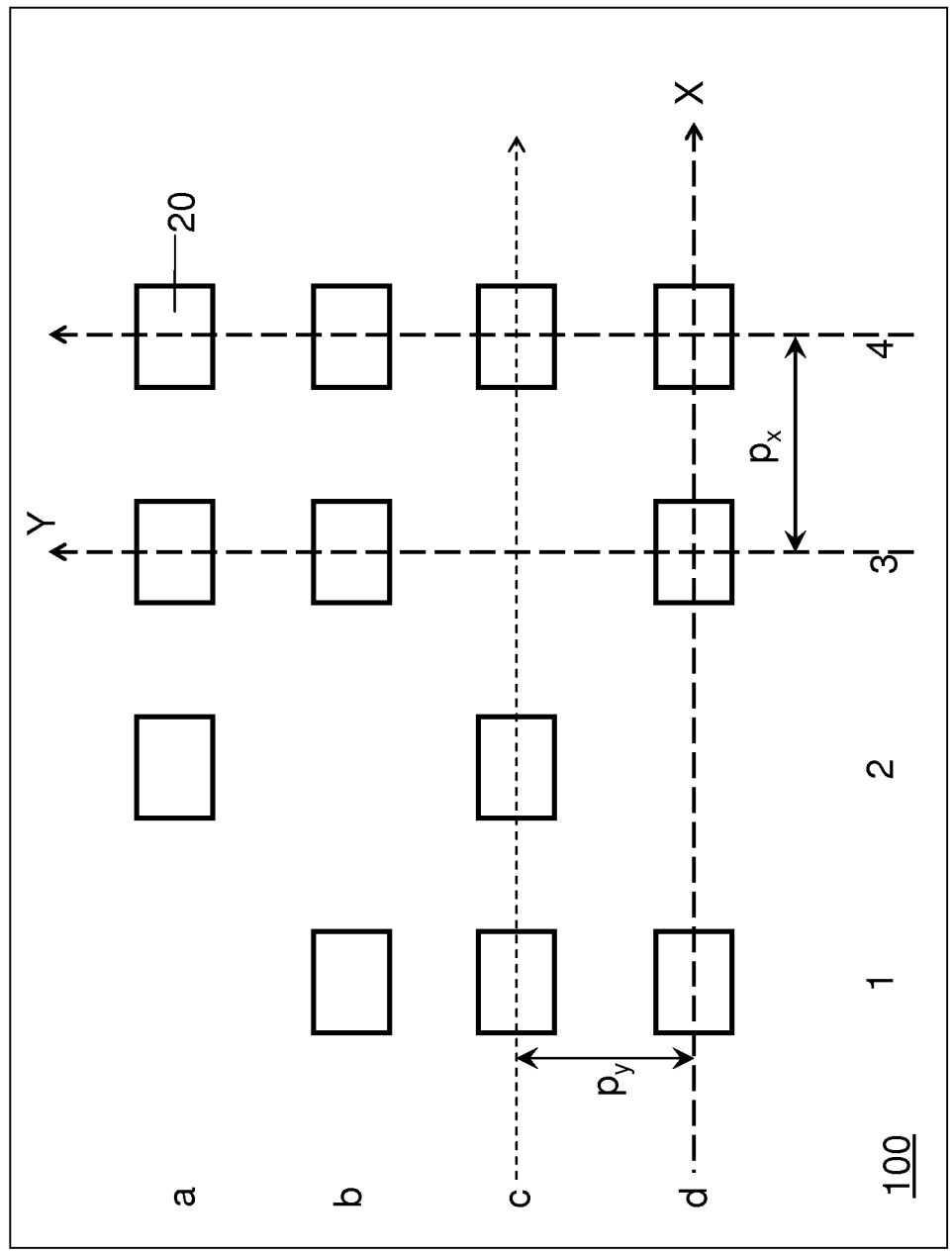
FIG. 1 illustrates an array of contacts formed on a grid in accordance with embodiments of the invention.

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

Embodiments of the present invention achieve technical advantages by providing a method to simultaneously increase process margin, yield, and product performance using double patterning techniques. The present invention will be described with respect to preferred embodiments in a specific context, namely printing contacts for MOS transistors. The invention may also be applied, however, to other types of devices that require contacts such as diodes, bipolar junction transistors, thyristors, and memory devices such as DRAM, FeRAM, phase change memories, or floating gate devices. Similarly, the invention may also be applied to other types of devices in other applications and other technological fields. Embodiments of the invention may be implemented in many types of semiconductor devices, such as logic, memory, peripheral circuitry, power applications, and other types of semiconductor devices, as examples.

The present invention will be described with respect to preferred embodiments in a specific context, namely an optical lithography method for the reproduction of patterns of very small dimensions. This invention may also be applied to semiconductor fabrication processes where other forms of lithography are used; for example, where the wavelength of the electromagnetic waves used to transfer the patterns is on the same order as the pattern dimensions. The present invention can also be used in lithographic processes outside the semiconductor field; for example, in processes where the interaction between wavelength, numerical aperture of the imaging system, and minimum pitch between structures distort the reproduction of mask patterns, or where small features require masks with very small apertures.

One of the challenges in lithography includes the formation of contacts, especially narrow contacts, primarily due to a narrow process window. Forming contacts in tight spaces, for example, between adjacent gate lines in a scaled cell, is extremely challenging since any mistakes result in undesirable shorts or undesirable capacitive coupling between source and gate lines. However, contacts should also be large enough to minimize resistance. In various embodiments, the present invention overcomes these limitations by using a double patterning and freeze technique in contact formation. Instead of forming small apertures in the mask, the contacts are formed by a summation of multiple exposures of lines over multiple mask layers. The shape of the lines in each mask layer governs the final shape of the contact. Using embodiments of the invention, contacts of desirable dimensions that minimize resistances can be fabricated without degrading process margin.

FIG. 1 illustrates an array of contacts formed on a grid in accordance with embodiments of the invention. Alternate structural embodiments are described with respect to FIG. 2. FIG. 3 describes a mask set, and FIG. 4 describes a method of fabrication using the mask set of FIG. 3. FIGS. 5 and 7 illustrate embodiments of the invention for forming contacts of different shape or length. An embodiment of the invention using negative tone resist is described in FIG. 6. Embodiments for implementing contacts for a 6T SRAM cell and NAND cell are described with respect to FIGS. 8 and 9.

FIG. 1 illustrates a top cross section of an array of contacts on a semiconductor device fabricated using embodiments of the invention.

Referring to FIG. 1, the contacts 20 couple underlying regions disposed on a substrate 100. In various embodiments, the contacts 20 are formed over a grid like array. The grid is formed by first, second, third, and fourth rows a-d and first, second, third, and fourth columns 1-4, the rows being parallel to a first axis (x-axis "X"), the columns being parallel to a second orthogonal axis (y axis "Y"). In various embodiments, the distance between rows, row spacing or vertical pitch $p_y$ is constant. Similarly, the column spacing or horizontal pitch $p_x$, is a constant thus forming the grid. Typically, the horizontal pitch $p_x$ is about the same as the vertical pitch $p_y$ in one embodiment.

In various embodiments, the contacts 20 are aligned along the first axis x, and along the second orthogonal axis y. In particular the contacts are formed at the intersection of rows and columns. Hence, contacts 20 are formed on intersections b1, c1, d1, a2, c2, a3, b3, d3, a4, b4, c4, and d4. However, not all intersections of rows and columns form a contact. For example, in FIG. 1, the intersection c3 of the third row c and the third column 3 do not include a contact.

Figure 10A:
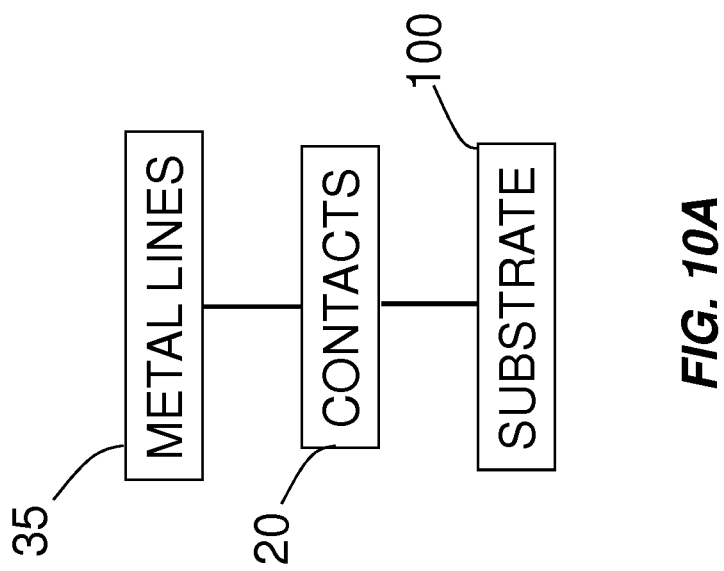

In various embodiments, the minimum spacing or vertical pitch $p_y$, for example, between rows is defined by a technology and/or process window of the lithography. In various embodiments, the contacts 20 comprise both contacts to the gate region as well as source/drain contacts. FIG. 10A illustrates contacts 20 coupling semiconductor regions disposed over the substrate 100 with metal lines 35. In some embodiments, the vias coupling different metallization levels are also formed on a grid array as described above. FIG. 10B illustrates contacts 20 coupling between metallization levels 35 and 36.

Figure 11:
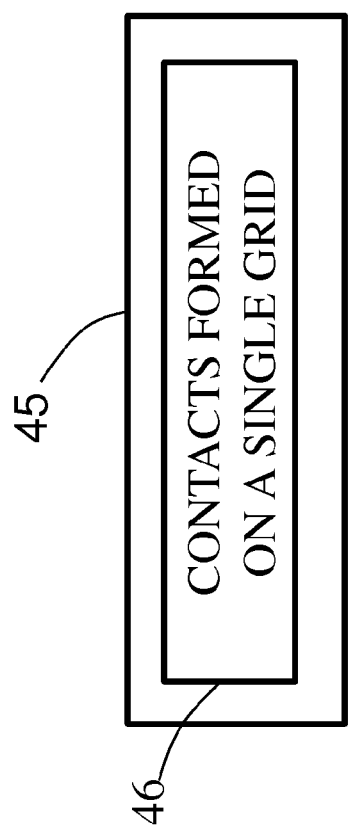
FIG. 11 illustrates an embodiment in which all regions of a chip have a single grid.
Figure 12:
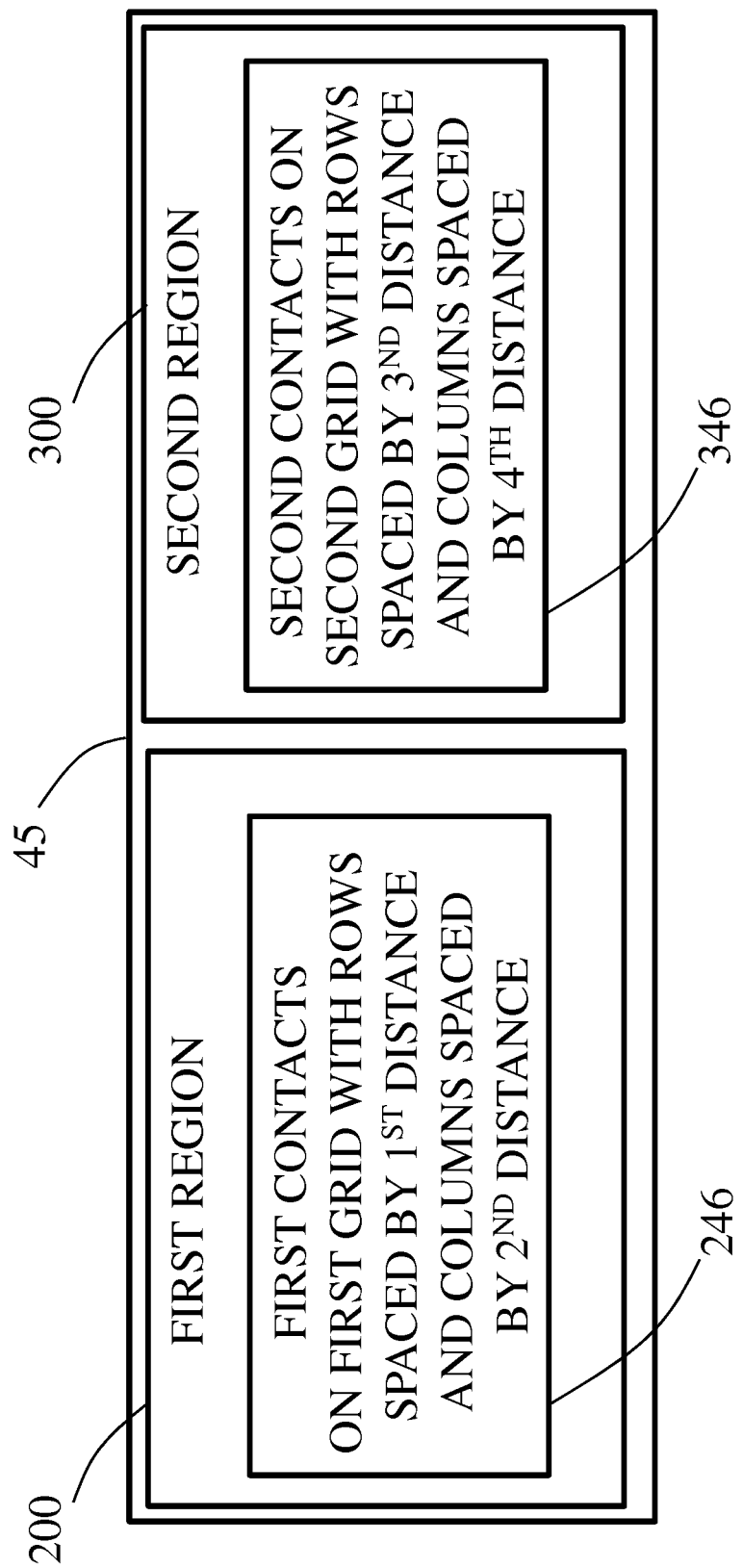
FIG. 12 illustrates an embodiment in which a chip divided into multiple regions with different contact grids.

In various embodiments, the grid extends over a large area of the semiconductor device. In particular, the same grid extends over a substantial portion of the circuitry. For example, in one embodiment all regions of the chip 45 have a single grid 46 as illustrated in FIG. 11. In another embodiment, as illustrated in FIG. 12, the chip 45 is divided into multiple regions with different contact grids. FIG. 12 illustrates a chip 45 having a first plurality of contacts disposed over a first region 200 of a substrate. The first plurality of contacts are disposed as rows and columns on a first orthogonal grid 246. Each row of the first plurality of contacts is spaced by a first distance, and each column of the first plurality of contacts being spaced by a second distance. A second plurality of contacts is disposed over a second region 300 of a substrate. The second plurality of contacts is disposed as rows and columns on a second orthogonal grid 346. Each row of the second plurality of contacts is spaced by a third distance, and each column of the second plurality of contacts being spaced by a fourth distance For example, the SRAM region comprises a first grid and the logic region comprises a second grid. In another embodiment, a system on a chip comprises a first grid over a first circuitry, for example, an analog or RF circuitry; a second grid over a second circuitry, for example, a logic circuitry; a third grid over a third circuitry, for example, over a volatile memory region; and a fourth circuitry over a non volatile memory.

Figure 2A:
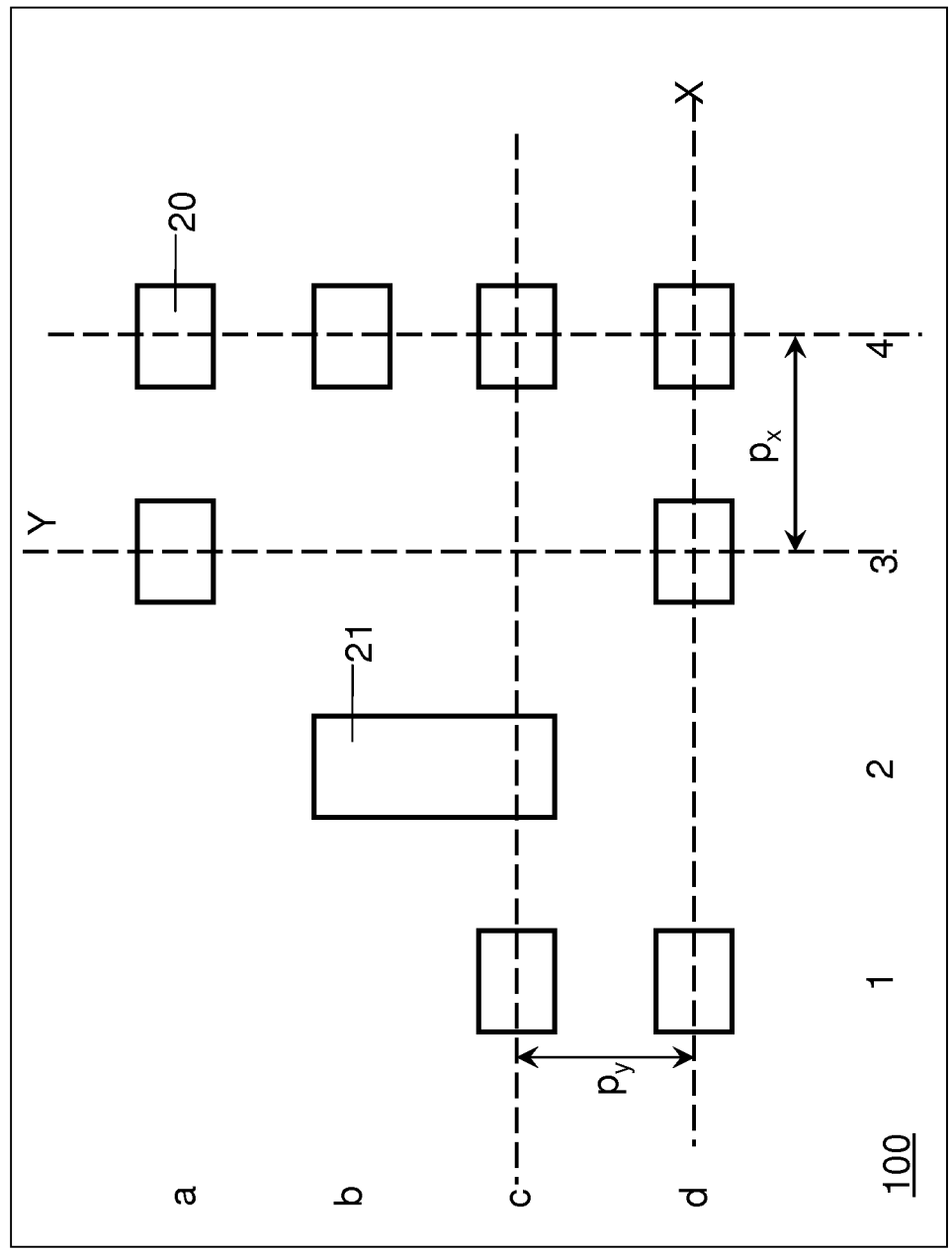
FIGS. 2a-2c, illustrates alternate shapes of contacts formed in various embodiments of the invention.
Figure 2B:
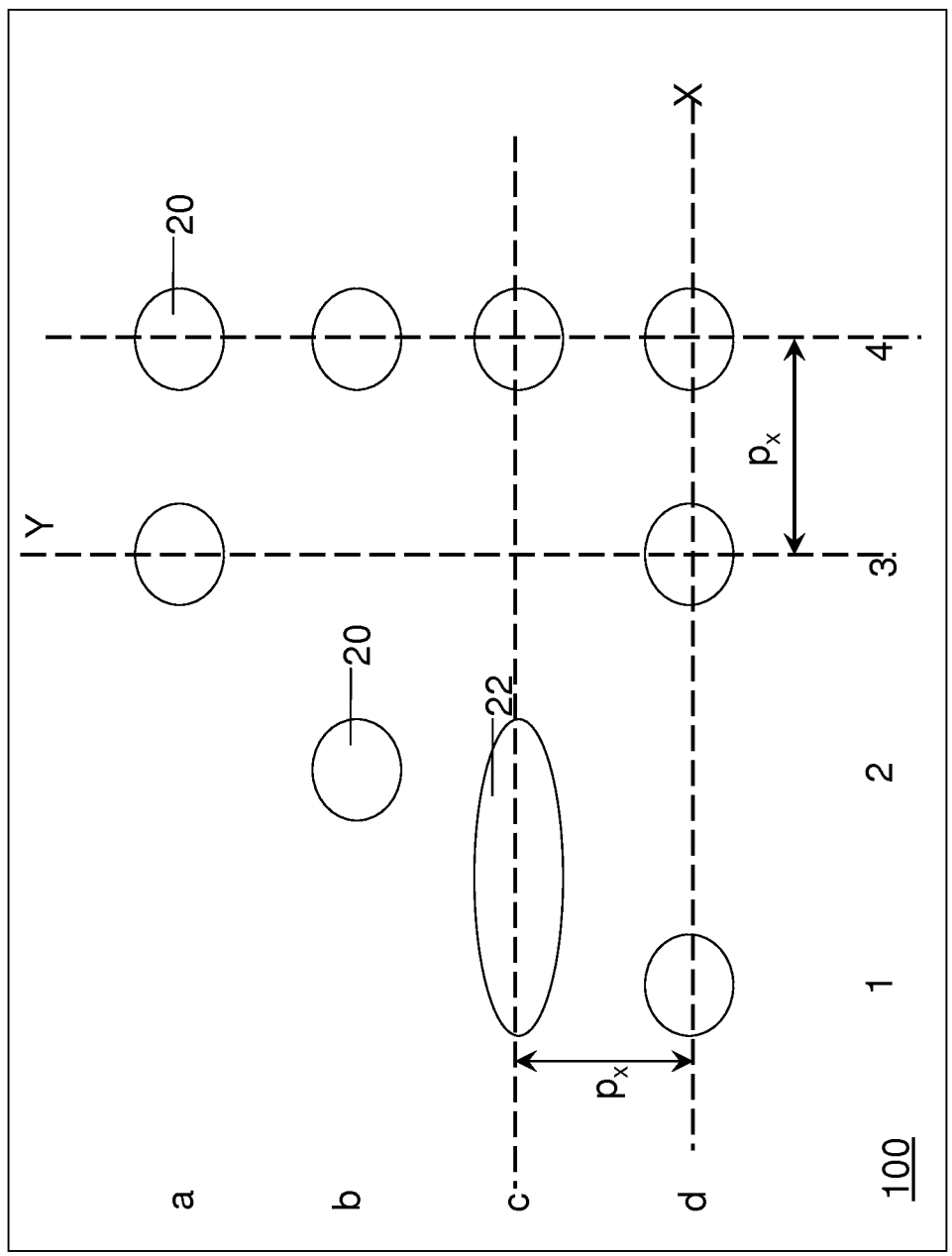
Figure 2C:
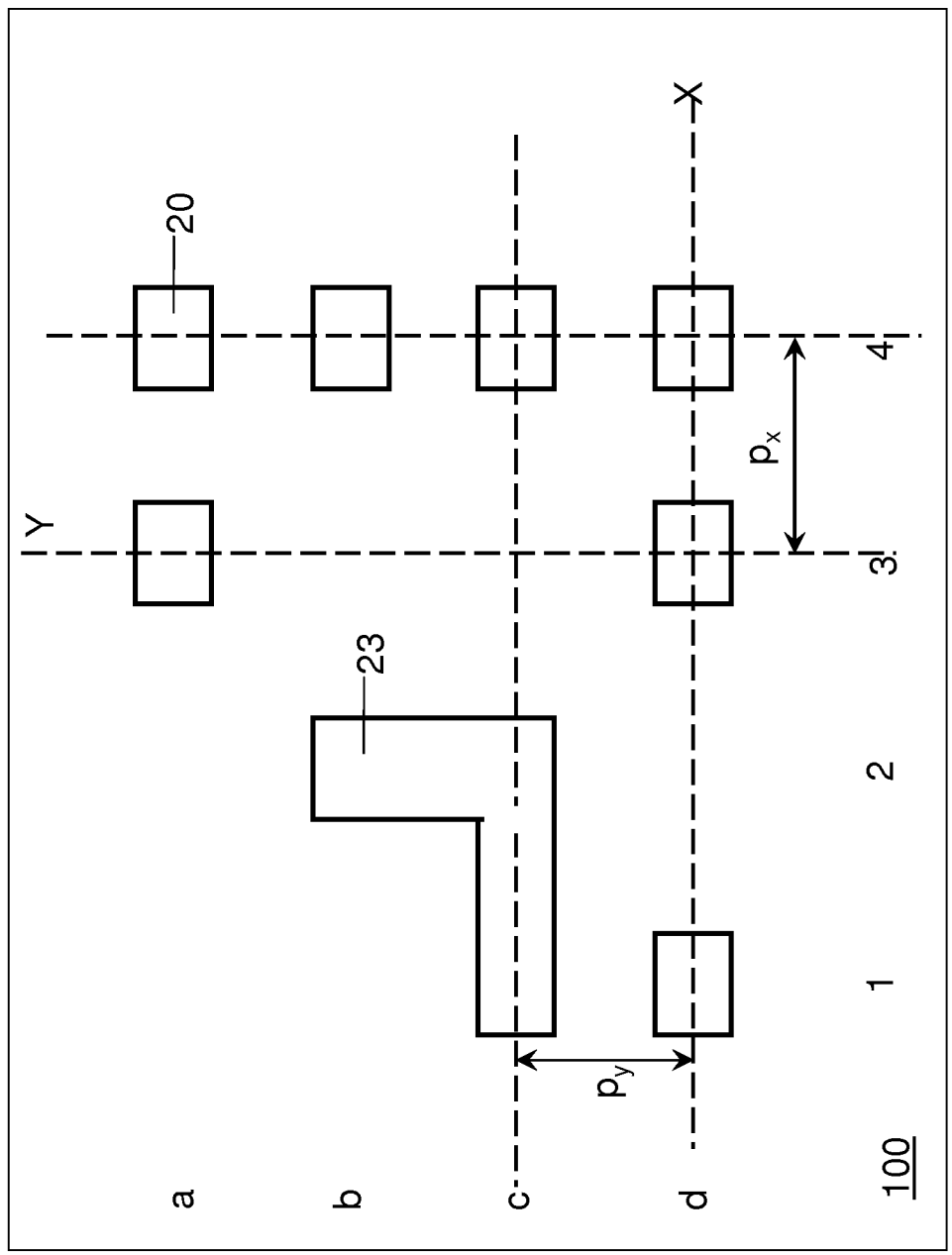

FIG. 2, which includes FIGS. 2a-2c, illustrates alternate shapes of contacts formed in various embodiments.

In various embodiments, the contacts 20 can comprise any suitable shape, for example, based on performance or layout requirements. Similarly, contacts 20 may comprise other dimensions than a contact with minimum dimension. The minimum dimension for the contact is typically defined by the technology and includes minimization of electrical parameters such as resistance and area while maximizing the process window for the fabrication processes to maximize process yield.

FIG. 2a illustrates a first alternate contact 21 that includes two neighboring contacts. The first alternate contact 21 extends from the intersection b2 to the neighboring intersection c2 along the second column 2. Hence, the length of the first alternate contact 21 comprises the twice the length of an individual minimum length contact and the vertical pitch $p_y$ between the neighboring contacts. Similarly, contacts 20 may comprise other lengths different than the minimum length.

FIG. 2b illustrates a second alternate contact 22 that also includes two neighboring contacts 20. The second alternate contact 22 includes the neighboring intersections c1 and c2 along the third row c. Hence, the width of the second alternate contact 22 comprises the twice the width of an individual minimum width contact and the horizontal pitch $p_x$ between the neighboring contacts. Similarly, contacts 20 may comprise other widths different than the minimum width. FIG. 2b also illustrates the contacts 20 comprising a circular shape, whereas the actual shape depends on a number of factors including lithographic imaging and features on the mask set as will be described in more detail below.

FIG. 2c illustrates a third alternate contact 23 that also includes three neighboring contacts 20. The third alternate contact 23 includes the two neighboring intersections c1 and c2 along the third row c. The third alternate contact 23 also includes the intersections b2 along the second column 2. Hence, the third alternate contact 23 comprises an "L-shaped" contact.

FIG. 3, which includes FIGS. 3a-3d, illustrates a mask used in the fabrication of the contacts in accordance with an embodiment of the invention.

Figure 3C:
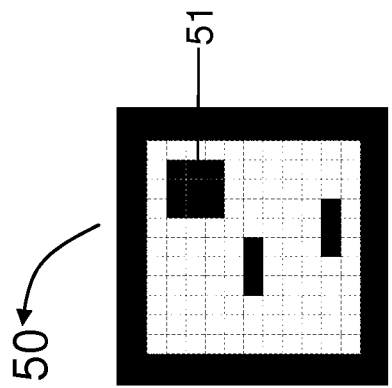
FIGS. 3a-3d, illustrates mask used in the fabrication of the contacts in accordance with embodiments of the invention.
Figure 3B:
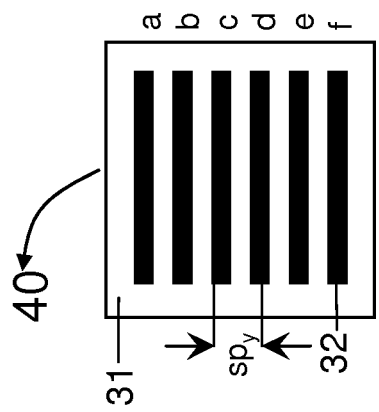

In various embodiments, the contacts 20 described above are fabricated using three exposures with three masks: a first mask 30 (FIG. 3a), a second mask 40 (FIG. 3b), and a third mask 50 (FIG. 3c). FIG. 3d illustrates a super position of the first, the second, and the third masks 30, 40, and 50 while forming the contacts. In various embodiments, the three exposures are performed using a double patterning technique. The patterning process comprises a first exposure with the first mask 30, develop and etch followed by a second exposure with the second mask 40, develop and etch, and a final third exposure through the third mask 50, develop and etch to form the final pattern.

Figure 3A:
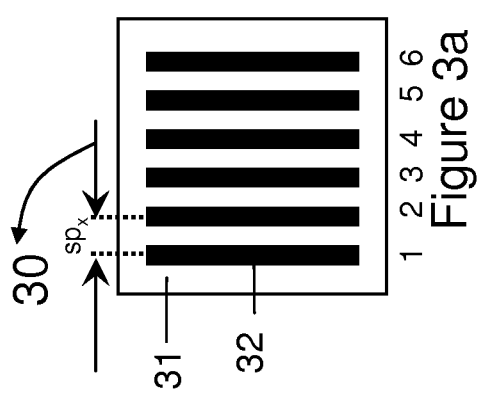
Figure 3D:
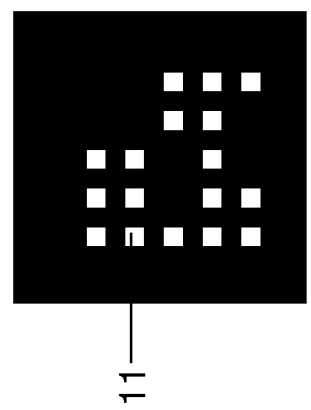

Referring to FIG. 3a, a first mask 30 comprises a plurality of lines comprising opaque regions 32 and transparent regions 31. The opaque regions 32 block radiation, and hence are not developed for a positive tone resist. The nearest distance between adjacent opaque regions 32 of the first mask 30 is fixed to a minimum distance, for example, a scaled horizontal pitch $sp_x$. The first exposure exposes a first photo resist through the transparent regions 31 in the first mask 30. Thus, the first exposure is used to pattern a plurality of lines.

After forming a first plurality of features on a template layer under the first photo resist layer, a second photo resist layer is formed over the patterned template layer. Subsequently, a second exposure using the second mask 40 is performed to expose the second photo resist layer.

Referring to FIG. 3b, the second mask 40 also comprises opaque regions 32 and transparent regions 31. The nearest distance between adjacent opaque regions 32 of the second mask 40 is fixed to a minimum distance, for example, scaled vertical pitch $sp_y$. However, the opaque regions 32 of the second mask 40 are aligned perpendicular to the opaque regions 32 of the first mask 30. The second photo resist layer is developed and etched to form second features on the template layer. The first and second features form a pattern for forming a grid of contacts. The first mask 30 and the second mask 40 may comprise additional alignment features to minimize errors in alignment with the first mask 30.

After forming a third photo resist layer, a third exposure using the third mask 50 is performed. As illustrated in FIG. 3c, the third mask 50 comprises cut features 51 that are opaque in one embodiment. A third mask 50 is used to cut or trim some of the second features from the template layer thus forming a pattern for forming contacts. If the third photo resist layer comprises a positive tone resist, some of the patterned first or second photo regions are filled up with the third photo resist layer after the third expose, develop, and etch processes. If a negative tone resist is used as the third photo resist layer, the first and/or second features are removed by the cut features 51. The features of the patterned first, second, and third photo resist layer are transferred to appropriate underlying layers.

FIG. 3d shows the effective mask using the first, the second, and the third masks 30, 40, and 50 when all the three masks are exposed using a positive tone resist and the exposure from each exposure is added to form the final feature as in a double patterning process, for example, by the use of freeze in technique. The composite features 11 show the regions that are exposed by all the three regions. Hence, if all the three masks are exposed using positive tone resist, these regions form the contacts 20 illustrated, for example, in FIG. 1. However, the contacts 20, e.g., of FIG. 1 can be fabricated using a positive resist, a negative resist, or a combination (the mask design could be suitably adjusted).

Thus in various embodiments, the mask set avoids the problems with exposing through a small aperture mask as each individual mask level comprises a plurality of lines. The illumination conditions are selected to maximize the image quality, for example, minimize across chip line width variation, over a range of process window parameters such as depth of focus, exposure dose, and mask error factor. The mask design has been explained in terms of opaque and transparent regions to clearly describe the embodiments of the invention. However, actual mask design and materials can be chosen to incorporate modifications to improve the imaging system. For example, to improve image resolution, the mask design may comprise attenuated phase shifter materials and/or alternating mask materials in opaque regions 32 and transparent regions 31 of FIG. 3a. Similarly, to improve depth of focus, the mask design for each layer may comprise OPC features such as hammerheads, serifs, and sub-resolution assist features, etc.

FIGS. 4a-4j provide cross-sectional diagrams illustrating an embodiment method of the present invention using the first mask 30, the second mask 40, and the third mask 50 of FIG. 3.

The device is fabricated using conventional processing in front end of the line manufacturing, wherein active device regions are fabricated. During front end processing, device regions including isolation regions, gate electrode, gate dielectric, source/drain regions, source/drain extension regions, and channel regions are fabricated. After forming source/drain regions, a silicide region is formed over the source/drain regions, and optionally over the gate electrode regions.

Figure 4A:
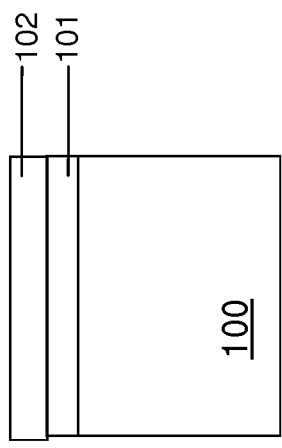
FIG. 4, which includes FIGS. 4a-4j, provides cross-sectional diagrams illustrating a method of fabrication using the first mask 30, the second mask 40, and the third mask 50 of FIG. 3, in accordance with embodiments of the present invention.

A first photo resist layer 102 is deposited over a first layer 101 (layer to be patterned to form contact openings). Referring to FIG. 4a, a first layer 101 to be patterned is deposited over a substrate 100. Some examples of the substrate 100 are a bulk mono-crystalline silicon substrate (or a layer grown thereon or otherwise formed therein), a layer of (110) silicon on a (100) silicon wafer, a layer of a silicon-on-insulator (SOI) wafer, or a layer of a germanium-on-insulator (GeOI) wafer. In other embodiments, other semiconductors, such as silicon germanium, germanium, gallium arsenide, indium arsenide, indium gallium arsenide, indium antimonide or others can be used with the wafer.

In various embodiments, the active devices are formed on the substrate 100 using conventional processing techniques. For example, in one embodiment, active regions including source/drain regions, source/drain extensions, channel regions, and gate regions of MOS transistors are fabricated on the substrate 100.

In various embodiments, the first layer 101 comprises an insulating layer. Further the first layer 101 is deposited over a etch stop liner (not shown). The etch stop liner is deposited over the substrate 100, for example. For example, a nitride film (e.g., silicon nitride) is deposited over the silicide regions. The first layer 101 preferably comprises insulating materials typically used in semiconductor manufacturing for inter-level dielectric (ILD) layers, such as $SiO_2$, tetra ethyl oxysilane (TEOS), fluorinated TEOS (FTEOS), doped glass (BPSG, PSG, BSG), organo silicate glass (OSG), fluorinated silicate glass (FSG), spin-on glass (SOG), SiN, SiON, or low k insulating materials, e.g., having a dielectric constant of about 4 or less, or combinations or multiple layers thereof, as examples, although alternatively, the first layer 101 may comprise other materials. The first layer 101 may comprise a thickness of about 500 nm or less, for example, although alternatively, the first layer 101 may comprise other dimensions.

Figure 4B:
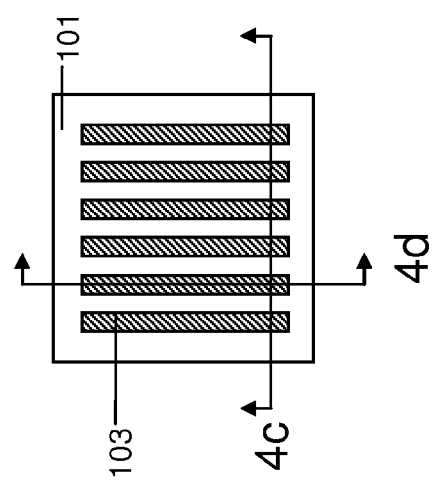
Figure 4C:
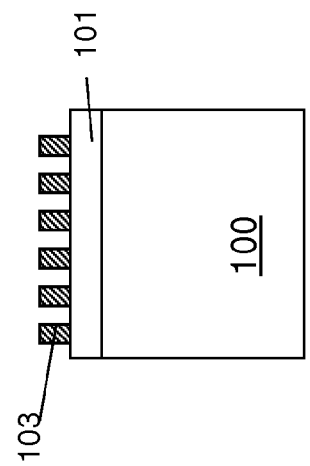
Figure 4D:
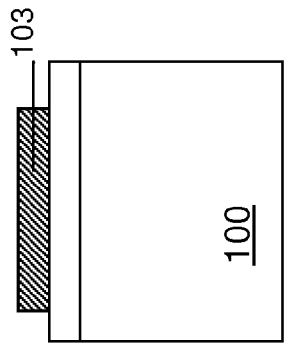

A frozen resist 103 is formed from the first photo resist layer 102 after patterning and freezing. FIGS. 4b-4d illustrate a portion of a semiconductor device after the first exposure as discussed above. FIG. 4b illustrates a top view, whereas FIGS. 4c and 4d illustrate cross sectional views.

The first photo resist layer 102 is exposed with the first mask 30 shown in FIG. 3a. The photo resist layer 102 is developed and etched to form a pattern of first features. The first features comprise a plurality of lines oriented in a first direction. The first features are frozen by a suitable freezing technique. The suitable freezing technique can include thermal curing, ion implantation, polymer encasing, or any other surface treatment that changes the first photo resist layer 102 into a frozen resist 103. The frozen resist 103 is insoluble to subsequent developer solutions preserving the first features from the first mask.

Figure 4F:
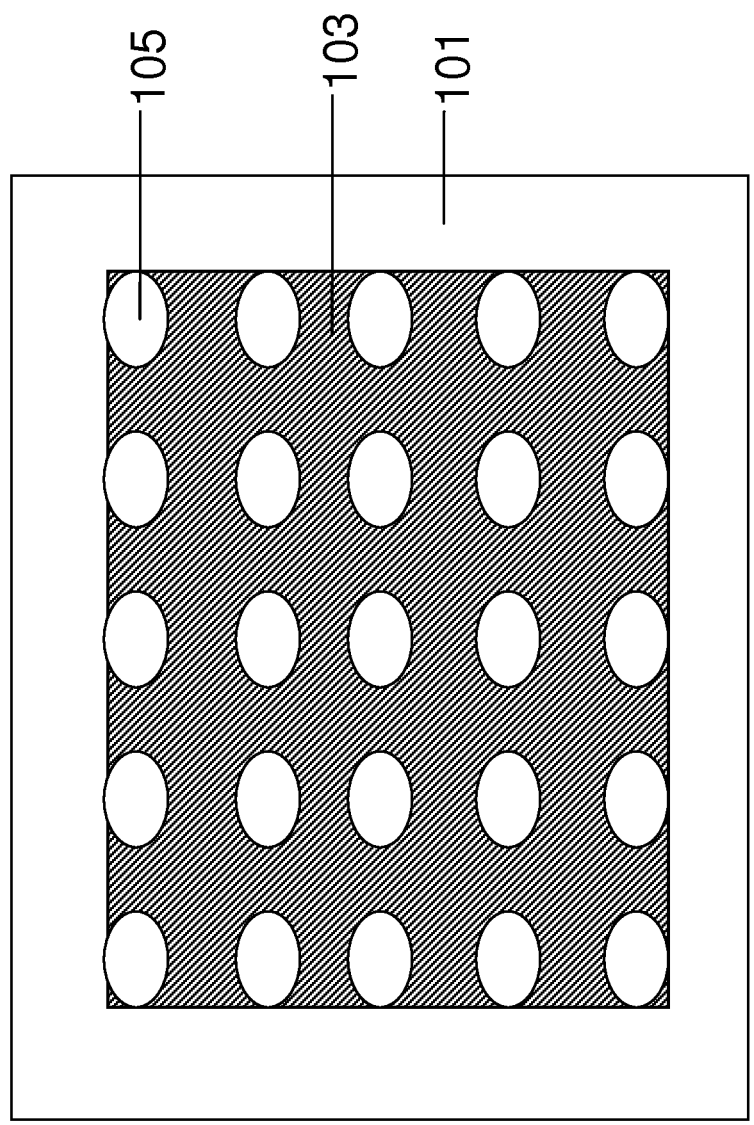

As illustrated in FIG. 4e, a second photo resist layer 104 is deposited over the frozen resist 103. The second photo resist layer 104 is patterned with the second mask 40 of FIG. 3b and frozen to form further frozen resist 103 (FIG. 4f). The freezing technique for the second photo resist layer 104 is similar to the prior freezing technique, although in other embodiments, the freezing technique is different. FIG. 4f illustrates the top cross section after the second freezing step. As the plurality of lines of the first mask 30 is oriented perpendicular to the plurality of lines of the second mask 40 (e.g., FIG. 3d), after the second freezing technique, resist openings 105 are formed. The resist openings 105 are more rounded in shape although the overlap masks form openings that are rectilinear in shape.

Figure 4G:
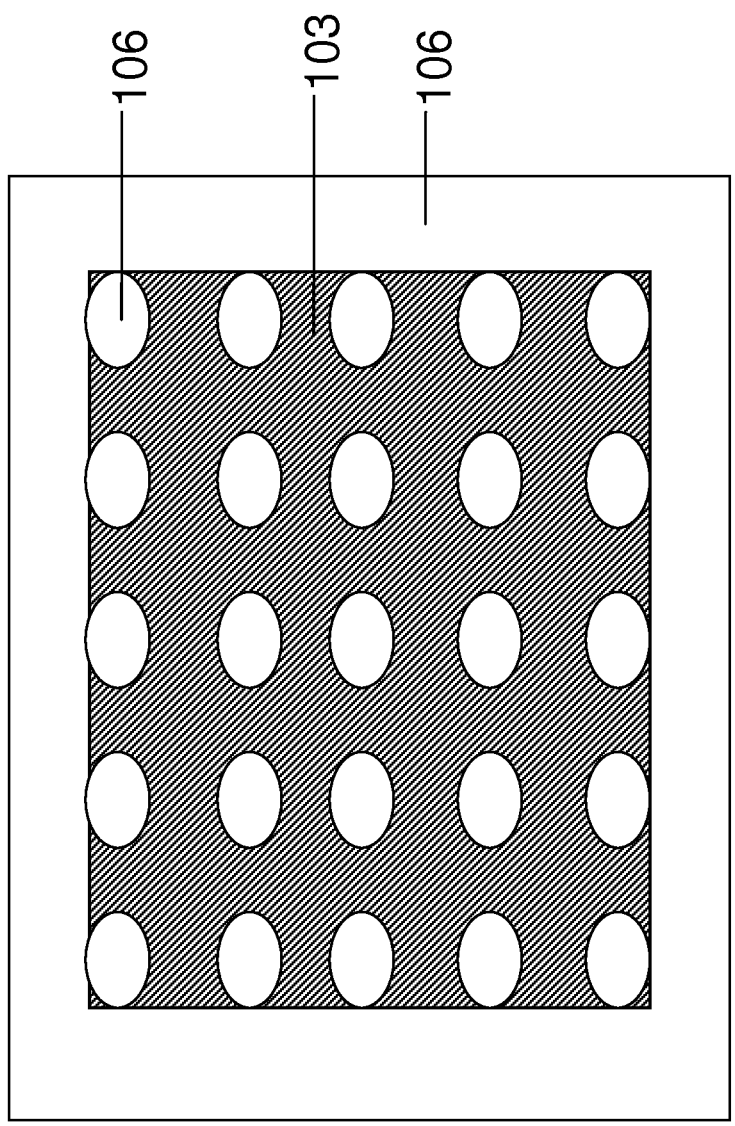
Figure 4H:
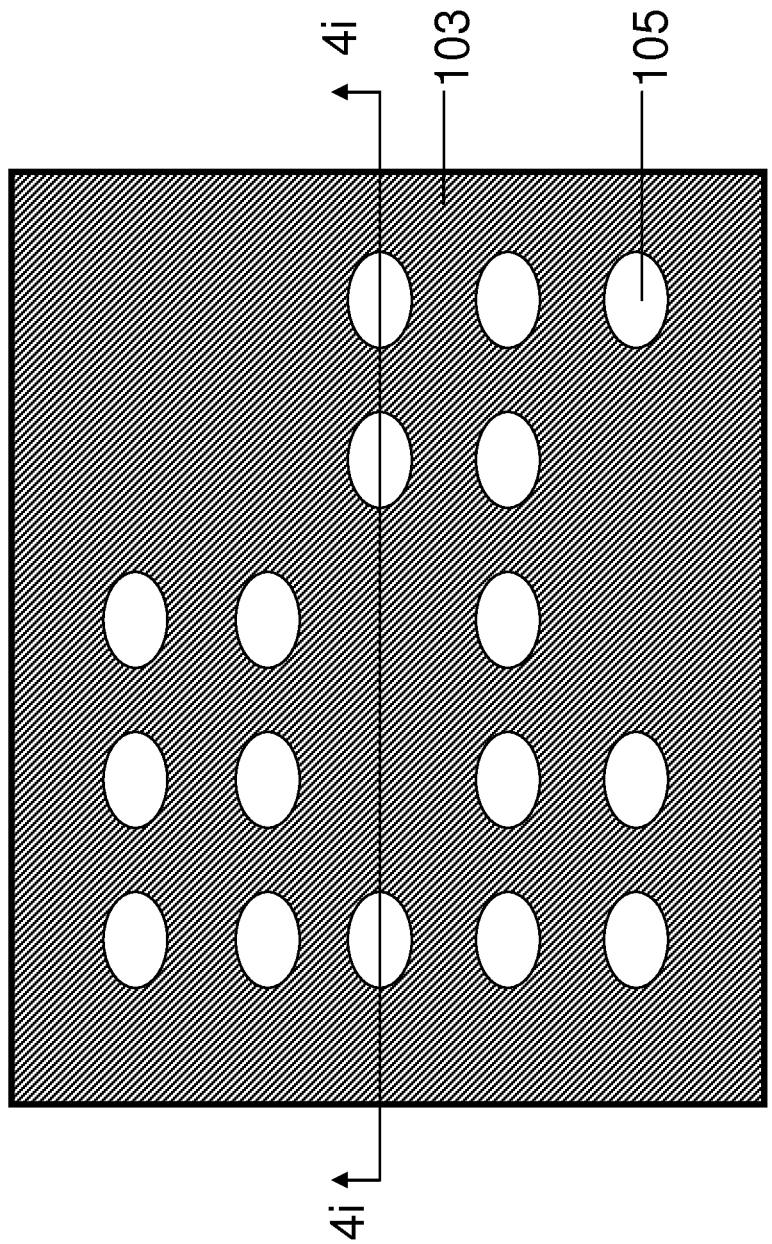

Referring to FIG. 4g, a third photo resist layer 106 is coated over the substrate 100. The third photo resist layer 106 is exposed using the third mask 50 (FIG. 3c), developed and etched. FIGS. 4h and 4i illustrate the structure after patterning the third photo resist layer 106 to form frozen resist 103. FIG. 4h shows a top view and FIG. 4i shows a cross sectional view. The patterned third photo resist layer 106 including the frozen resist 103 forms the template for forming contact holes.

Figure 4J:
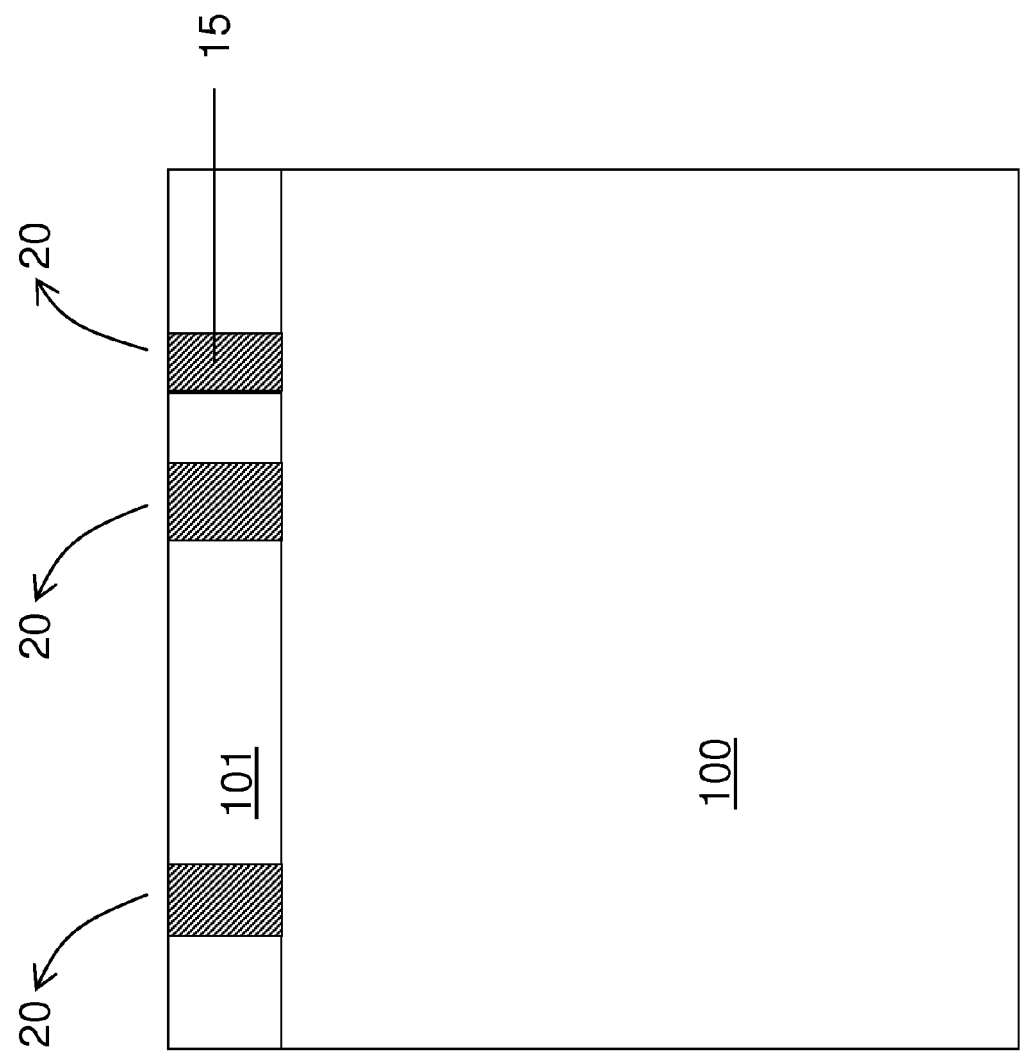

Referring to FIG. 4j, the first layer 101 is etched using the template thus formed to form contact holes. The contact holes are filled with a conductive liner and a conductive material 15 forming the contacts 20. The conductive material 15 preferably comprises W, although copper, aluminum, Al—Cu—Si, other metals and combinations thereof may also be used. If the conductive material 15 comprises W, preferably a bi-layer seed layer comprising CVD titanium nitride and silicon doped tungsten are used. In some embodiments, the contact plug is filled with copper, forgoing forming a conductive liner which may be problematic in deeply scaled technologies.

In one embodiment, contacts 20 comprise contacts plugs that couple conductive regions on substrate 100, for example silicide regions on substrate 100. In another embodiment, the contacts 20 comprise contact plugs to couple first metal lines in the metallization layers with gate electrodes of devices disposed on substrate 100. In various embodiments, the first layer 101 comprises multiple layers, for example, a liner followed by an interlevel dielectric layer. Subsequent processing continues as in conventional processing. For example, further levels of metallization comprising metal lines and vias are formed over the contacts 20.

FIG. 5, which includes FIGS. 5a-5e, illustrates embodiments of the invention using additional notches or breaks. FIGS. 5a-5c illustrate a mask set used in forming the features, FIG. 5d illustrates an overlay of the masks, and FIG. 5e illustrates features formed using the mask set.

Using the embodiments of FIG. 5, various shapes and sizes of the contacts can be formed. FIG. 5a illustrates a first mask 30 similar to FIG. 3a. However, unlike FIG. 3a, the first mask 30 of FIG. 5a comprises additional features such as first notches 115. The notches are either opaque or transparent based on the type of mask process (bright field or dark field). As shown in FIG. 5a, the first notches 115 form discontinuous lines of opaque regions 32. Similarly, FIG. 5b illustrates a second mask 40 with a second notch 116. A composite image formed using the mask set is illustrated in FIG. 5d. Hence, a vertical contact 121 and a horizontal contact 122 are formed. The vertical and horizontal contacts 121 and 122, in various embodiments, are formed without using contacts that are off grid.

Figure 6D:
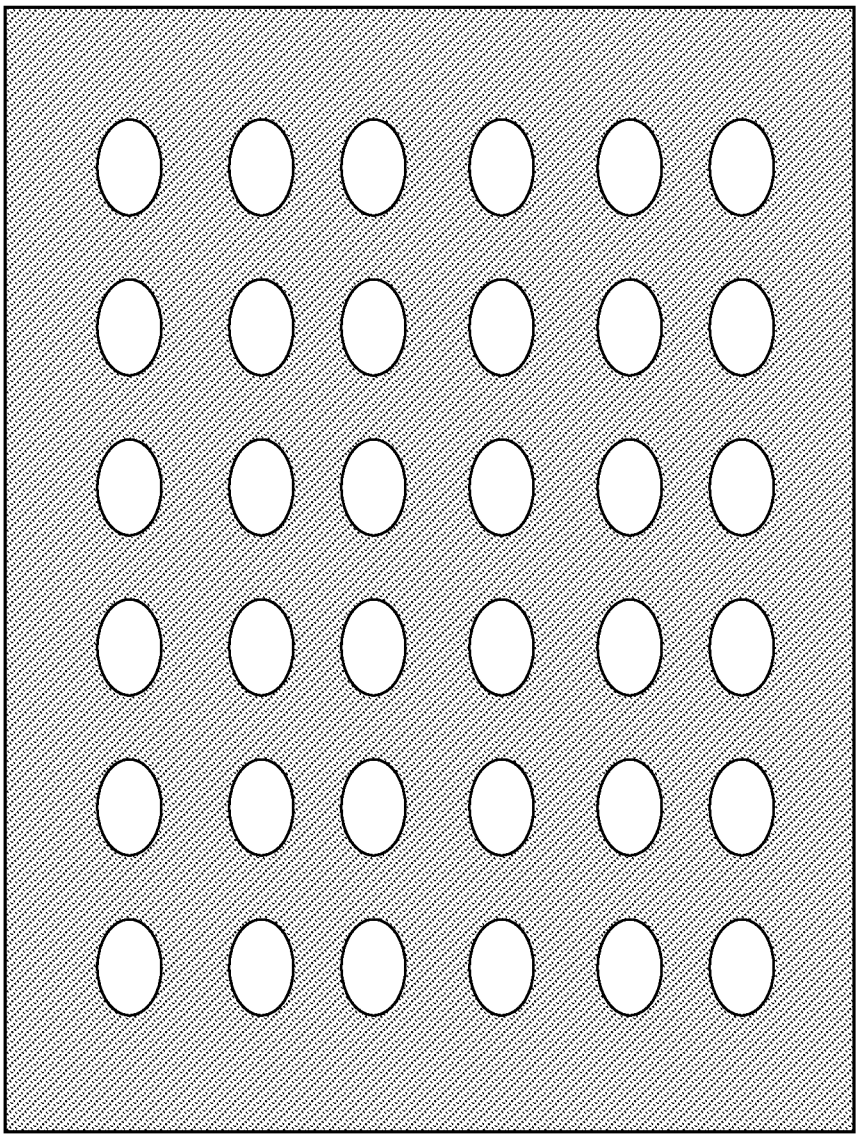
Figure 6E:
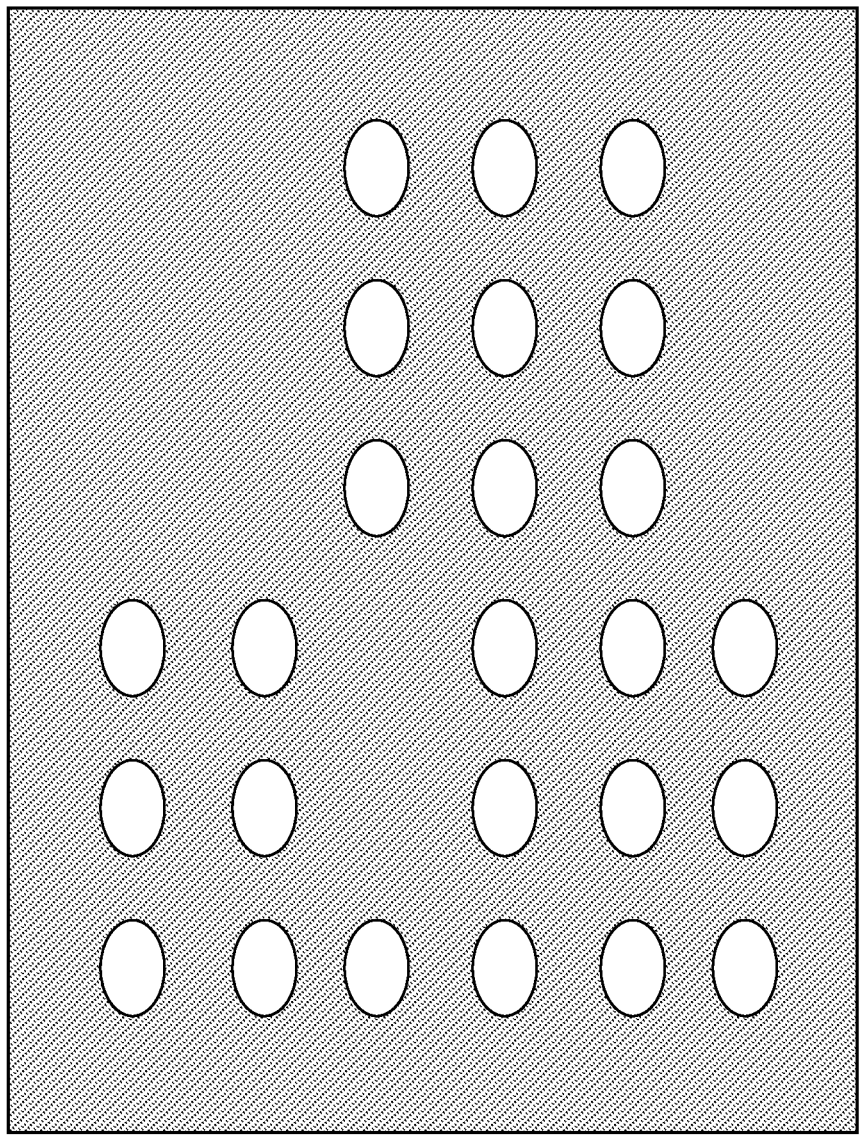

FIG. 6, which includes FIGS. 6a-6e, illustrates an embodiment of forming contacts using negative tone resist for the first and second exposures, and a positive tone resist for the third exposure step.

FIGS. 6a-6c illustrate an embodiment of the invention wherein the first mask 30 of FIG. 3a is used with a negative photo resist. Hence, the areas not exposed by the light exposure are developed and removed. As shown in FIG. 6d, after a suitable freezing step, a second negative photo resist is coated and exposed with the second mask 40 of FIG. 3b. As discussed in prior embodiments, a third photo resist layer 106 is coated and patterned using the third mask 50 of FIG. 3c. The resulting pattern is used to form contact holes in the first layer 101 as in prior embodiments. However, the contact holes of this embodiment are displaced with respect to the prior embodiments due to the use of negative photo resist.

Figure 7B:
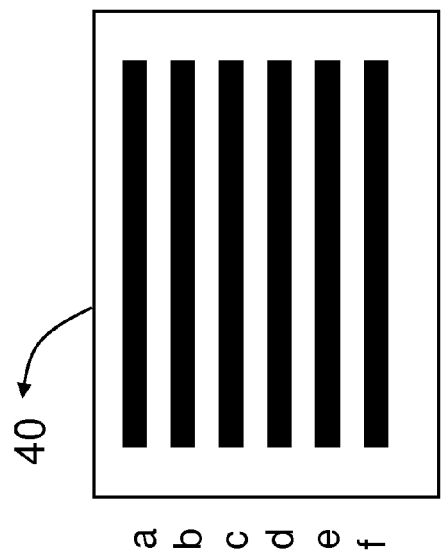
FIGS. 7a-7d, illustrates embodiments of the invention for manufacturing a layout wherein some contacts are not aligned on a grid.
Figure 7D:
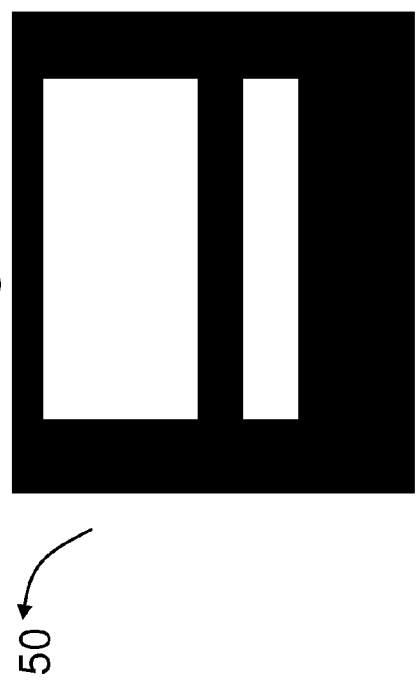
Figure 7A:
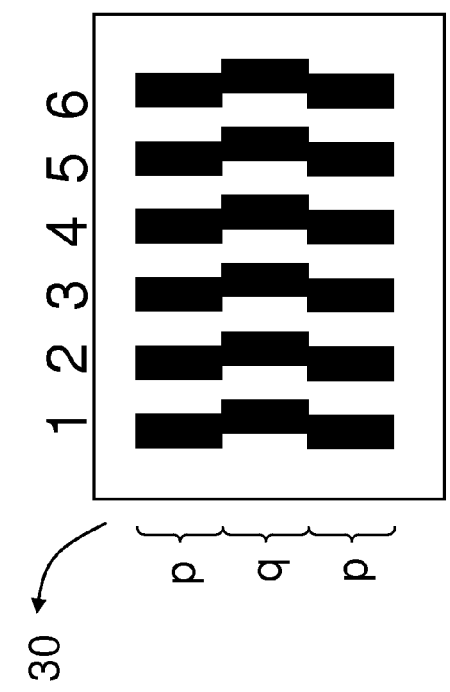
Figure 7C:
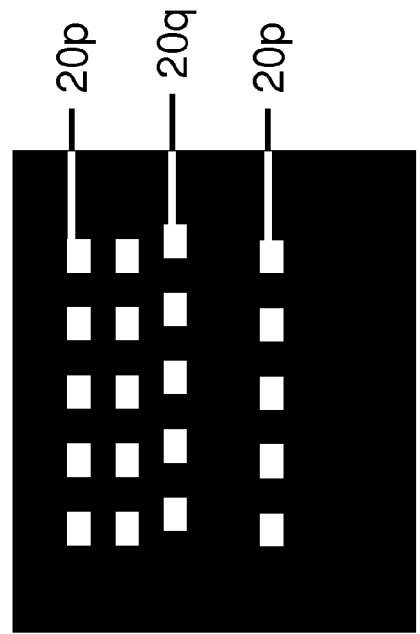

FIG. 7, which includes FIGS. 7a-7d, illustrates embodiments of the invention using additional line segments. FIGS. 7a-7d illustrate a mask set used in forming the features, FIG. 7d illustrates an overlay of the masks.

In FIG. 7, not all the contacts are disposed on a grid. In some layouts, some of the contacts need to be offset relative to the main grid. In such situations, a portion of the contacts can be made to line up on a different grid. FIG. 7a illustrates a first mask 30 comprising a first section p comprising a first plurality of lines, and a second section q comprising a second plurality of lines. The first section p is offset relative to the second section q. After the freeze-in process as described above, the workpiece is exposed using the second mask 40 and the third mask 50. The feature formed on the workpiece is illustrated in FIG. 7d, that comprises contacts formed on multiple grids. A first set of contacts 20p are formed on a first grid formed from the first section p of the first mask 30 superimposed with the second mask 40. A second set of contacts 20q are formed on a second grid formed from the second section q of the first mask 30 superimposed with the second mask 40. Hence, by using a predetermined set of allowable grids, further design optimizations are enabled.

FIG. 8, which includes FIGS. 8a-8d, illustrates a 6T SRAM cell in accordance with embodiments of the invention.

Figure 8A:
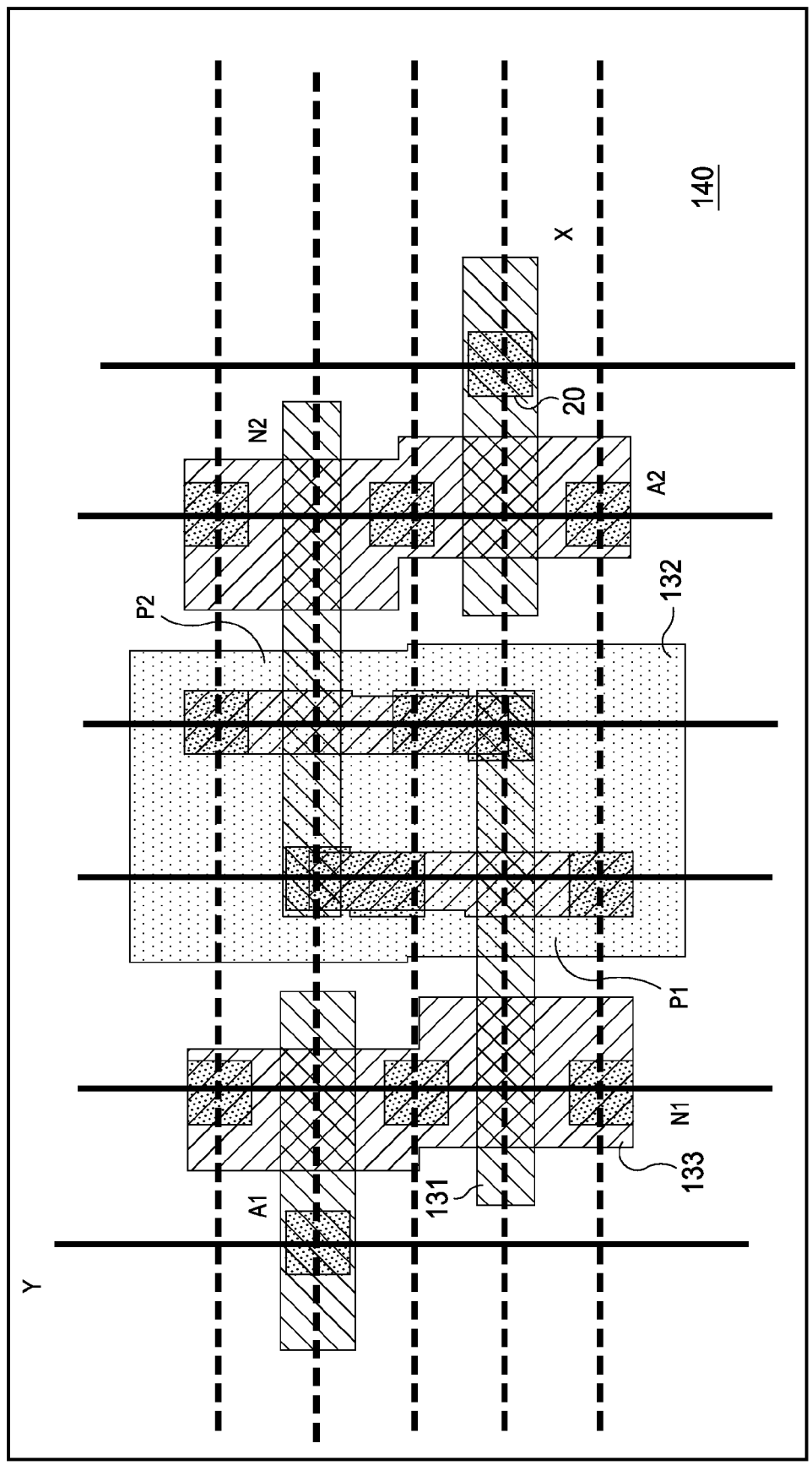
FIG. 8, which includes 8a-8d, illustrates a 6T SRAM cell designed or fabricated in accordance with embodiments of the invention.

FIG. 8a illustrates a layout of a 6T SRAM cell. The 6T SRAM cell comprises a first and a second access transistor A1 and A2, a first and a second NMOS transistor N1 and N2, and a first and a second PMOS transistor P1 and P2. The transistors are formed by forming active regions separated by isolation regions 140. The transistors comprise gate lines 131, pwell regions 132, and nwell regions 133 that also include the channel and source/drain regions of the transistors. As illustrated in FIG. 8a, the contacts 20 are formed at the intersection of the grid that is formed by lines parallel to X axis and Y axis.

Figure 8B:
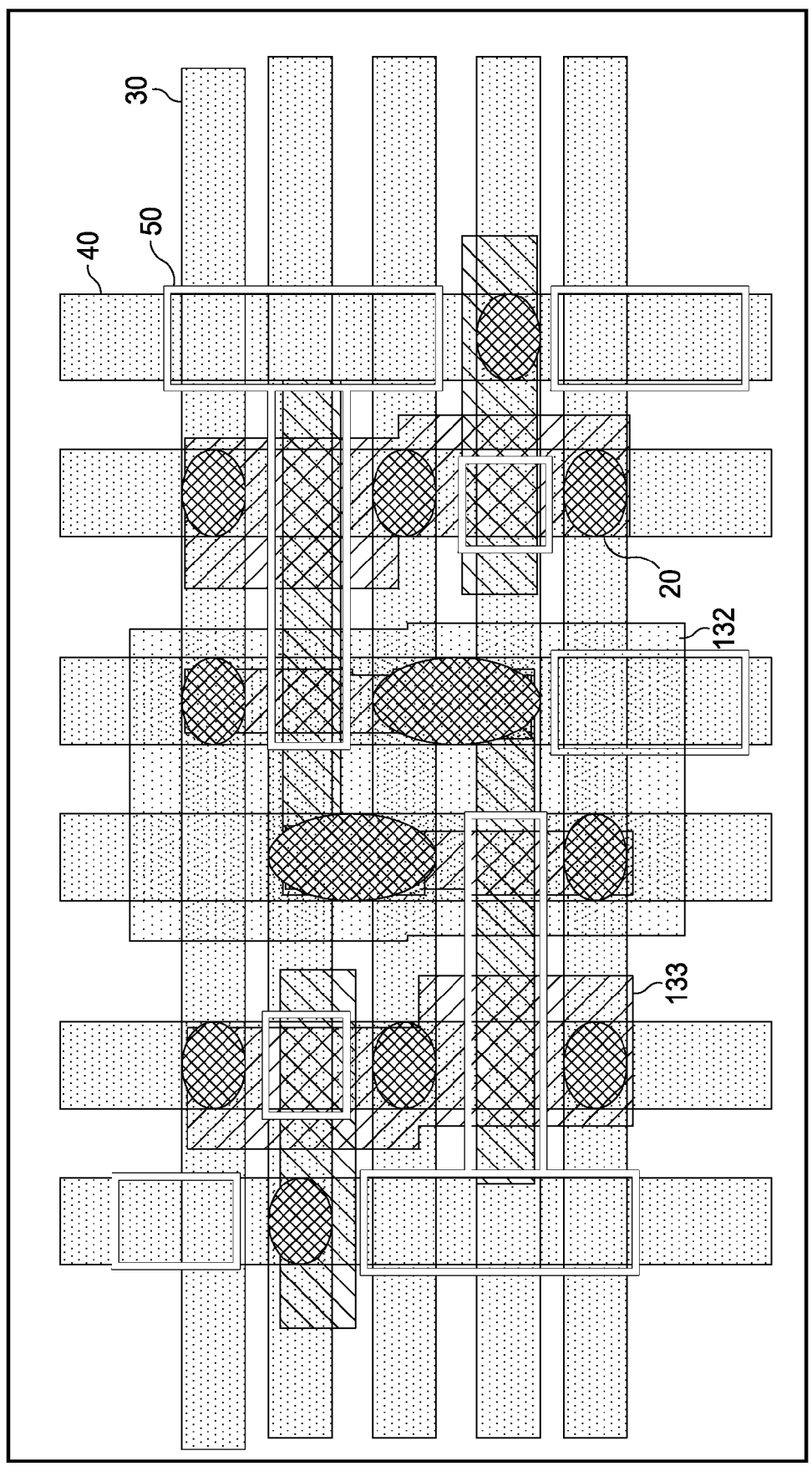
Figure 8C:
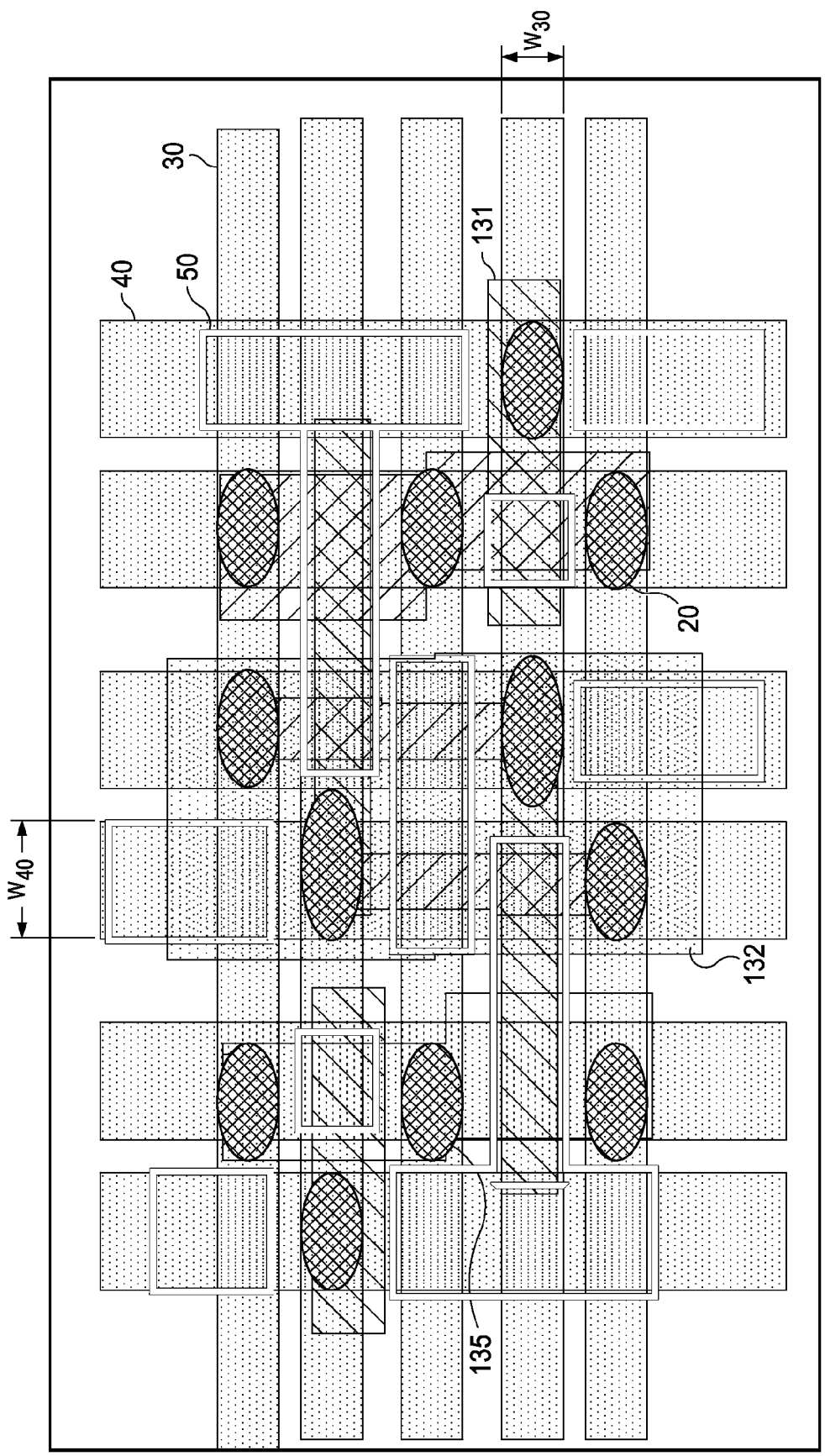

FIG. 8b illustrates the 6T SRAM cell with an overlay of the first, the second, and the third masks 30, 40, and 50. Hence, the contacts 20 are formed in regions commonly exposed by the first mask 30 and the second mask 40, but not formed in any regions under the third mask 50. FIG. 8c illustrates the 6T SRAM wherein the distance between adjacent gate lines 131 is reduced to decrease cell area. As shown, the width of the contact is made smaller to accommodate the areal shrink of the SRAM cell. As illustrated in FIG. 8c, the first width $W_{30}$ of plurality of lines on the first mask 30 is smaller than the second width $W_{40}$ of plurality of lines on the second mask 40. Hence, the width of the contact is elongate along the plurality lines of the first mask 30, this allowing contact formation with large process margins even between adjacent gate lines 131. See, for example, a narrow width contact 135 disposed between adjacent gate lines 131.

Figure 8D:
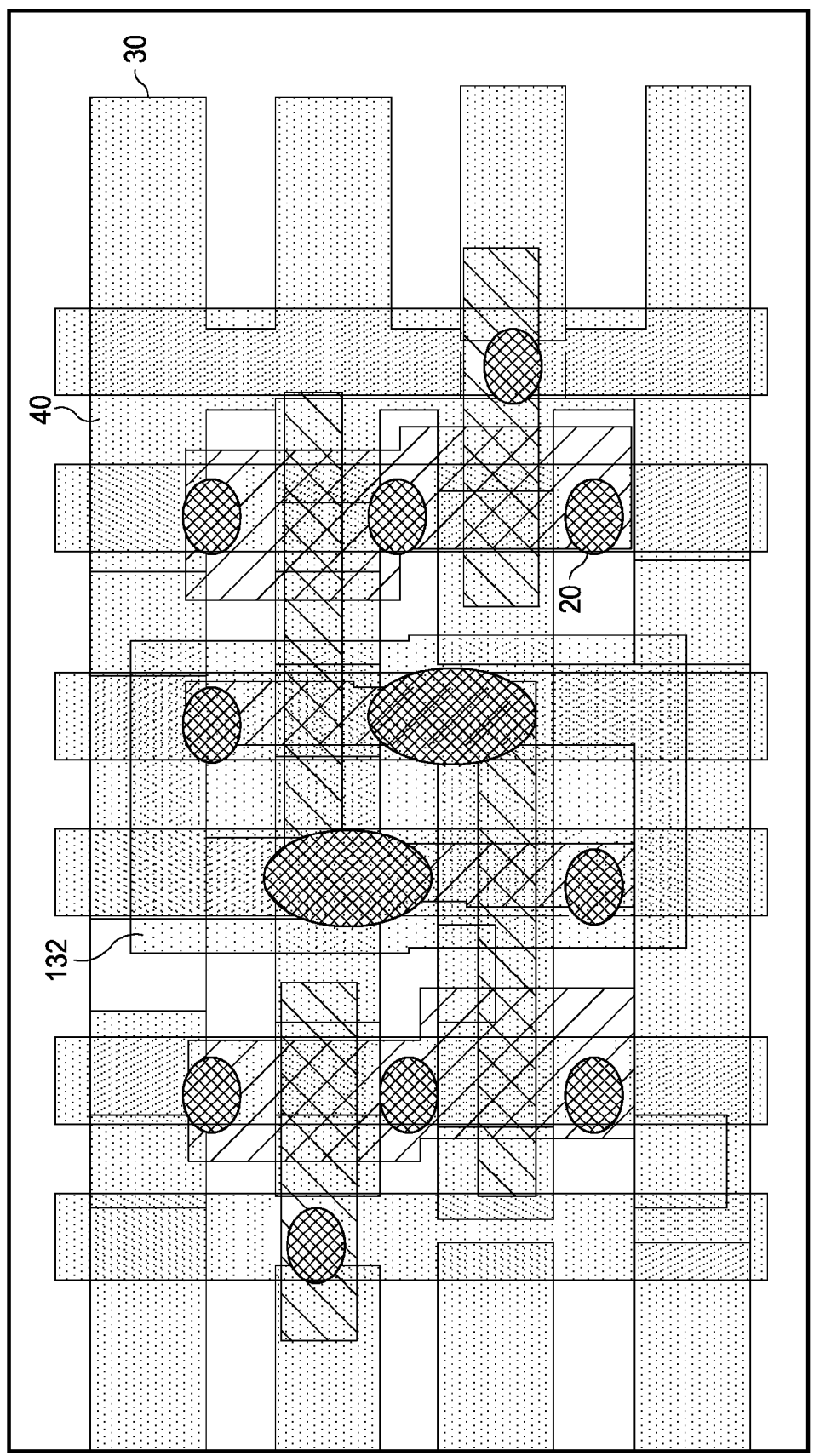

FIG. 8d illustrates an alternate embodiment using a reverse process so that the contacts 20 are formed in regions not exposed by the first and the second masks 30 and 40.

Figure 9A:
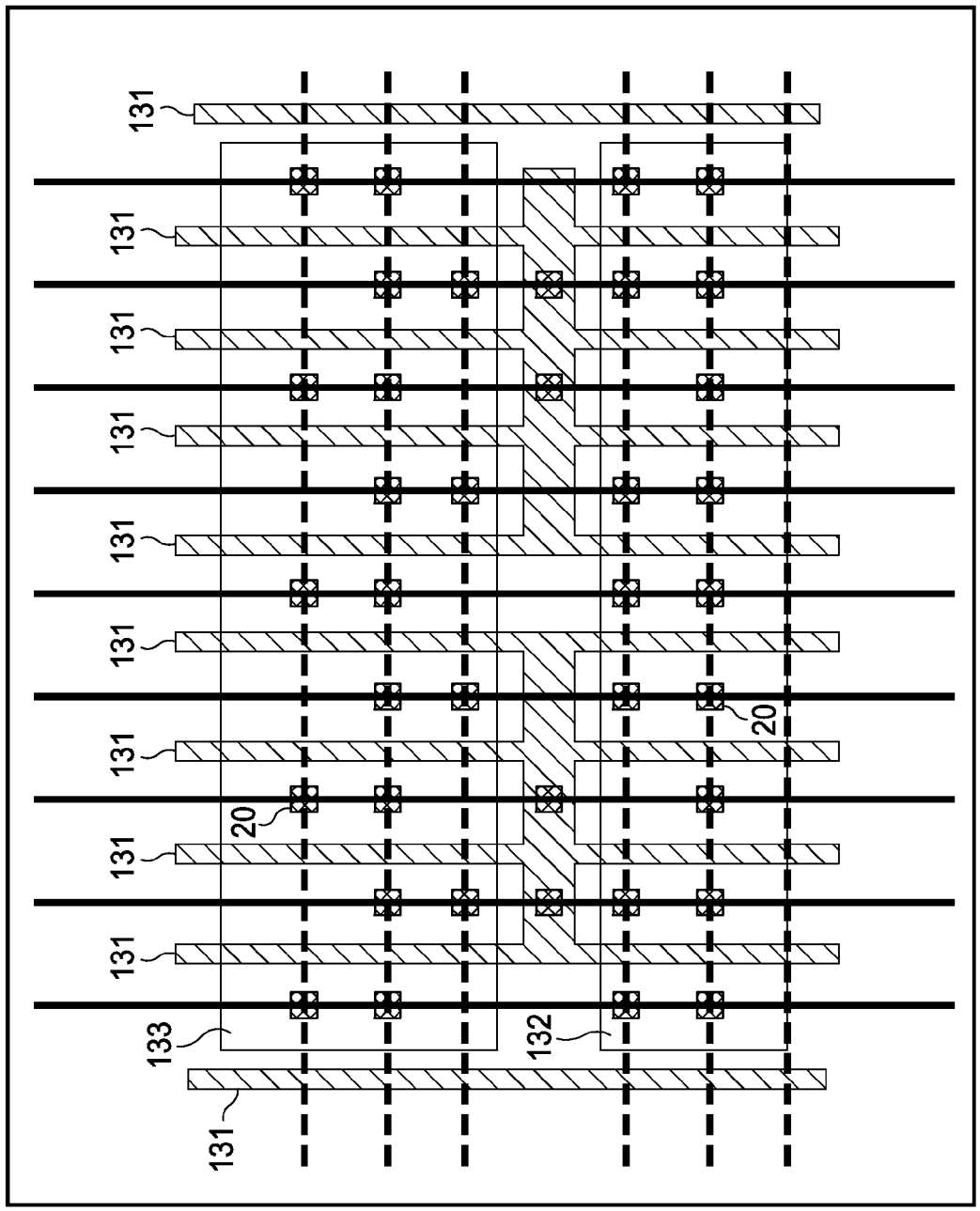
FIGS. 9a and 9b, illustrates a NAND cell designed or fabricated in accordance with embodiments of the invention.
Figure 9B:
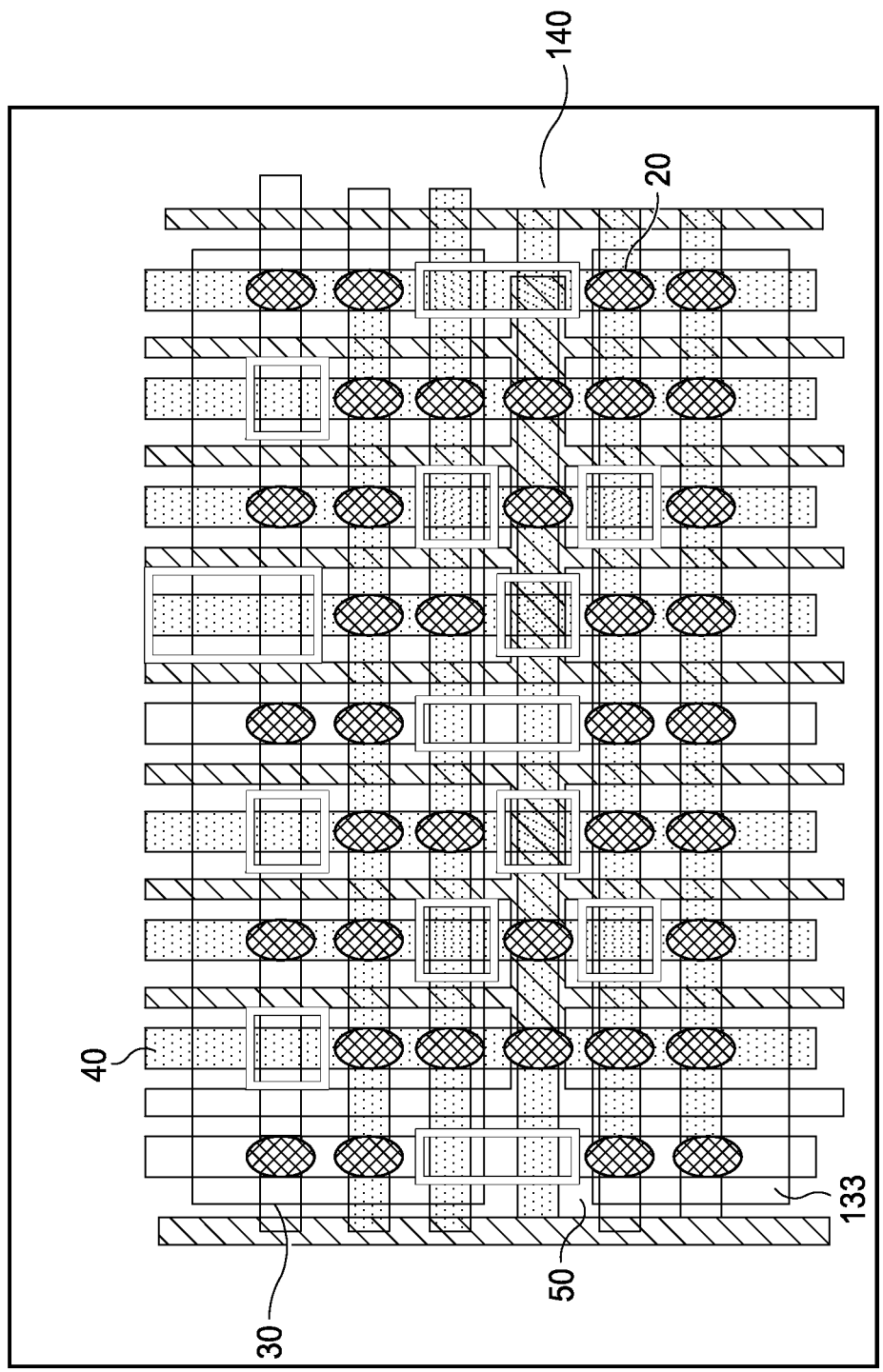

FIG. 9, which includes FIGS. 9a and 9b, illustrates a NAND cell in accordance with embodiments of the invention. The transistors are formed by forming active regions separated by isolation regions 140. The transistors comprise gate lines 131, pwell regions 132, and nwell regions 133. The pwell regions 132 and nwell regions 133 also include the channel and source/drain regions of the transistors (not shown). As illustrated in FIG. 9a, the contacts 20 are formed at the intersection of the grid that is formed by lines parallel to X axis and Y axis. FIG. 9b illustrates the NAND cell with an overlay of the first and the second masks 30 and 40. Hence, the contacts 20 are formed in regions commonly exposed by the first mask 30 and the second mask 40, but not formed in any regions under the third mask 50.

Although the contacts described above are for first metal levels, in various embodiments, vias coupling various metal levels can be formed using embodiments of the invention. Hence, in some embodiments some or all levels of vias are formed as gridded contacts.

Although the present invention and its advantages have been described in detail, it should be understood that various changes, substitutions and alterations can be made herein without departing from the spirit and scope of the invention as defined by the appended claims. For example, it will be readily understood by those skilled in the art that many of the features, functions, processes, and materials described herein may be varied while remaining within the scope of the present invention.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method of manufacturing a semiconductor device, the method comprising:
    forming an insulating layer over a substrate;
    coating a first photo resist layer over the insulating layer;
    using a first mask, patterning the first photo resist layer thereby forming first features oriented in a first direction, the first mask comprising a first plurality of lines oriented in the first direction;

after patterning the first photo resist layer, coating a second photo resist layer;

using a second mask, patterning the second photo resist layer thereby forming second features oriented in a second direction, wherein the second mask comprises a second plurality of lines oriented in the second direction orthogonal to the first direction, wherein the second mask is aligned relative to the first mask such that the first features are perpendicular to the second features;

after patterning the second photo resist layer, coating a third photo resist layer;

using a third mask, patterning the third photo resist layer thereby forming third features, wherein the first, the second, and the third features comprise a pattern for forming contact holes; and forming contact holes by etching the insulating layer using the first, the second, and the third features.

2. The method of claim 1, further comprising:

freezing the first features after patterning the first photo resist layer, wherein the second photo resist layer is coated after freezing the first features; and freezing the second features after patterning the second photo resist layer, wherein the third photo resist layer is coated after freezing the second features.

3. The method of claim 2, wherein freezing the first features comprises performing a surface treatment to the first features rendering them insoluble to subsequent developer solutions.

4. The method of claim 2, wherein the first photo resist layer is insoluble to subsequent developer solutions preserving the first features after freezing the first features.

5. The method of claim 2, wherein freezing the first features comprises thermal curing, ion implantation, or polymer encasing.

6. The method of claim 5, wherein freezing the second features comprises thermal curing, ion implantation, or polymer encasing.

7. The method of claim 2, wherein the second photo resist layer is insoluble to subsequent developer solutions preserving the second features after freezing the second features.

8. The method of claim 1, wherein the contact holes are formed in regions patterned by each of the first mask, the second mask, and the third mask.

9. The method of claim 1, wherein the contact holes are formed in regions exposed by each of the first mask, the second mask, and the third mask.

10. The method of claim 1, wherein the first, the second, and the third photo resists are each a positive tone resist.

11. The method of claim 1, wherein the first photo resist and the second photo resist are each a negative tone resist.

12. The method of claim 1, wherein the pattern for contact holes is formed on an orthogonal grid formed by the first plurality of lines and the second plurality of lines, wherein the pattern comprises a first pattern for a first contact hole and a second pattern for a second contact hole, wherein the first pattern is disposed along a first row, wherein the second pattern is disposed along a first column, wherein the first row and the first column intersect at a grid point on the orthogonal grid, and wherein no third features are disposed at the grid point.

13. The method of claim 12, further comprising forming contacts by filling the contact holes with a conductive material, wherein the contacts couple semiconductor regions with metal lines disposed over the substrate.

14. The method of claim 12, further comprising forming contacts by filling the contact holes with a conductive material, wherein the contacts couple between metallization levels disposed over the substrate.

15. A method of manufacturing a semiconductor device, the method comprising:

forming an insulating layer over a substrate;

forming a first photo resist layer over the insulating layer;

using a first mask, patterning the first photo resist layer thereby forming first features oriented in a first direction, the first mask comprising a first plurality of lines oriented in the first direction, wherein the first mask comprises a first notch such that a first line of the first plurality of lines is shorter than a second line of the first plurality of lines in a portion of the first mask;

after patterning the first photo resist layer, patterning a second photo resist layer using a second mask thereby forming second features oriented in a second direction, wherein the second mask comprises a second plurality of lines oriented in the second direction orthogonal to the first direction, wherein the second mask is aligned relative to the first mask such that the first features are perpendicular to the second features; and after patterning the second photo resist layer, patterning a third photo resist layer using a third mask thereby forming third features; and forming contact holes by etching the insulating layer using the first, the second, and the third features, the contact holes comprising a first contact hole in a region exposed through the first notch and a second contact hole, wherein the first contact hole has a length in the second direction longer than a length of the second contact hole in the second direction.

16. The method of claim 15, wherein the contact holes comprising a third contact hole and a fourth contact hole, wherein the third contact hole is disposed along a first row, wherein the fourth contact hole is disposed along a first column, wherein the first row and the first column intersect at a grid point on a orthogonal grid, and wherein no contact holes are disposed at the grid point.

17. The method of claim 15, wherein the second mask comprises a second notch such that a first line of the second plurality of lines is shorter than a second line of the second plurality of lines in a portion of the second mask, wherein the contact holes comprise a third contact hole in a region exposed through the second notch and a fourth contact hole, and wherein the third contact hole has a length in the first direction longer than a length of the fourth contact hole in the first direction.

18. The method of claim 15, further comprising:

freezing the first features after patterning the first photo resist layer, wherein the second photo resist layer is formed after freezing the first features; and freezing the second features after patterning the second photo resist layer, wherein the third photo resist layer is formed after freezing the second features.

19. The method of claim 18, wherein freezing the first features comprises thermal curing.

20. The method of claim 18, wherein freezing the first features comprises ion implantation.

21. The method of claim 18, wherein freezing the first features comprises polymer encasing.

22. A method of manufacturing a semiconductor device, the method comprising:

forming an insulating layer over a substrate;

coating a first photo resist layer over the insulating layer;

using a first mask, patterning the first photo resist layer thereby forming first features oriented in a first direction, the first mask comprising a first region and a second region, the first region having a first plurality of lines oriented in the first direction, the first plurality of lines spaced by a first distance, the second region having a second plurality of lines oriented in the first direction, the second plurality of lines spaced by a second distance, wherein the first distance is different from the second distance;

after patterning the first photo resist layer, coating a second photo resist layer;

using a second mask, patterning the second photo resist layer thereby forming second features oriented in a second direction orthogonal to the first direction, wherein the second mask comprises a third region and a fourth region, wherein the third region has a third plurality of lines oriented in the second direction, wherein the third plurality of lines are spaced by a third distance, wherein the fourth region has a fourth plurality of lines oriented in the second direction, wherein the fourth plurality of lines are spaced by a fourth distance, wherein the second mask is aligned relative to the first mask such that the first features are perpendicular to the second features;

after patterning the second photo resist layer, coating a third photo resist layer; and using a third mask, patterning the third photo resist layer thereby forming third features, wherein the first, the second, and the third features comprise a pattern for forming contact holes in the first region and the second region, wherein the pattern for contact holes is on a first orthogonal grid formed by the first plurality of lines and the third plurality of lines and a second orthogonal grid formed by the second plurality of lines and the fourth plurality of lines, wherein the pattern in the first region comprises a first pattern for a first contact hole and a second pattern for a second contact hole, wherein the first pattern is disposed along a first row, wherein the second pattern is disposed along a first column, wherein the first row and the first column intersect at a grid point on the first orthogonal grid, and wherein no third features are disposed at the grid point; and forming the contact holes in the first region and the second region by etching the insulating layer using the first, the second, and the third features.

23. The method of claim 22, further comprising:

freezing the first features after patterning the first photo resist layer, wherein the second photo resist layer is coated after freezing the first features; and freezing the second features after patterning the second photo resist layer, wherein the third photo resist layer is coated after freezing the second features.

24. The method of claim 22, wherein the first region comprises a SRAM cell, and wherein the second region comprises a logic cell.

25. The method of claim 22, wherein the first region comprises analog circuitry, and wherein the second region comprises logic circuitry.

26. The method of claim 22, wherein the third distance and the fourth distance are different.

* * * * *